(12) United States Patent
Yu et al.

(10) Patent No.: US 12,199,065 B2
(45) Date of Patent: Jan. 14, 2025

(54) MULTI-DIE PACKAGE STRUCTURES INCLUDING REDISTRIBUTION LAYERS

(71) Applicant: Parabellum Strategic Opportunities Fund LLC, Wilmington, DE (US)

(72) Inventors: Chen-Hua Yu, Hsinchu (TW);
Kuo-Chung Yee, Taoyuan (TW);
Tsung-Ding Wang, Tainan (TW);
Chien-Hsun Lee, Chu-Tung Town (TW)

(73) Assignee: Parabellum Strategic Opportunities Fund LLC, Wilmington, DE (US)

( * ) Notice: Subject to any disclaimer, the term of this patent is extended or adjusted under 35 U.S.C. 154(b) by 499 days.

(21) Appl. No.: 17/068,389

(22) Filed: Oct. 12, 2020

(65) Prior Publication Data

US 2021/0028147 A1  Jan. 28, 2021

Related U.S. Application Data

(62) Division of application No. 15/706,141, filed on Sep. 15, 2017, now Pat. No. 10,804,242, which is a
(Continued)

(51) Int. Cl.
*H01L 25/065* (2023.01)
*H01L 21/48* (2006.01)
(Continued)

(52) U.S. Cl.
CPC ........ *H01L 25/0652* (2013.01); *H01L 21/486* (2013.01); *H01L 21/563* (2013.01);
(Continued)

(58) Field of Classification Search
CPC ... H01L 25/062; H01L 25/0655; H01L 25/18; H01L 25/50; H01L 25/165; H01L 21/486;
(Continued)

(56) References Cited

U.S. PATENT DOCUMENTS

| 4,922,376 A | 5/1990 | Pommer et al. |
| 8,101,460 B2 * | 1/2012 | Pagaila ................. H01L 24/19 |
| | | 438/731 |

(Continued)

*Primary Examiner* — Didarul A Mazumder
*Assistant Examiner* — Gustavo G Ramallo
(74) *Attorney, Agent, or Firm* — Almanac IP Advisors LLP

(57) ABSTRACT

A semiconductor device and a method of making the same are provided. A first die and a second die are placed over a carrier substrate. A first molding material is formed adjacent to the first die and the second die. A first redistribution layer is formed overlying the first molding material. A through via is formed over the first redistribution layer. A package component is on the first redistribution layer next to the copper pillar. The package component includes a second redistribution layer. The package component is positioned so that it overlies both the first die and the second die in part. A second molding material is formed adjacent to the package component and the first copper pillar. A third redistribution layer is formed overlying the second molding material. The second redistribution layer is placed on a substrate and bonded to the substrate.

19 Claims, 22 Drawing Sheets

Related U.S. Application Data division of application No. 14/927,218, filed on Oct. 29, 2015, now Pat. No. 9,768,145.

(60) Provisional application No. 62/212,375, filed on Aug. 31, 2015.

(51) Int. Cl.

| | | |
|---|---|---|
| *H01L 21/56* | (2006.01) | |
| *H01L 21/768* | (2006.01) | |
| *H01L 23/00* | (2006.01) | |
| *H01L 23/31* | (2006.01) | |
| *H01L 23/367* | (2006.01) | |
| *H01L 23/498* | (2006.01) | |
| *H01L 23/522* | (2006.01) | |
| *H01L 25/00* | (2006.01) | |
| *H01L 25/18* | (2023.01) | |
| *H01L 23/538* | (2006.01) | |

(52) U.S. Cl.
CPC ...... *H01L 21/565* (2013.01); *H01L 21/76879* (2013.01); *H01L 23/3114* (2013.01); *H01L 23/367* (2013.01); *H01L 23/3675* (2013.01); *H01L 23/49811* (2013.01); *H01L 23/49827* (2013.01); *H01L 23/49838* (2013.01); *H01L 23/5226* (2013.01); *H01L 24/03* (2013.01); *H01L 24/09* (2013.01); *H01L 24/11* (2013.01); *H01L 24/17* (2013.01); *H01L 24/19* (2013.01); *H01L 24/20* (2013.01); *H01L 25/0655* (2013.01); *H01L 25/18* (2013.01); *H01L 25/50* (2013.01); *H01L 21/568* (2013.01); *H01L 23/3128* (2013.01); *H01L 23/49816* (2013.01); *H01L 23/5383* (2013.01); *H01L 23/5385* (2013.01); *H01L 23/5389* (2013.01); *H01L 2224/02381* (2013.01); *H01L 2224/04105* (2013.01); *H01L 2224/08137* (2013.01); *H01L 2224/08146* (2013.01); *H01L 2224/12105* (2013.01); *H01L 2224/13147* (2013.01); *H01L 2224/16145* (2013.01); *H01L 2224/16227* (2013.01); *H01L 2224/32245* (2013.01); *H01L 2224/73267* (2013.01); *H01L 2224/9222* (2013.01); *H01L 2225/06517* (2013.01); *H01L 2225/06524* (2013.01); *H01L 2225/06527* (2013.01); *H01L 2225/06541* (2013.01); *H01L 2225/06548* (2013.01); *H01L 2225/06589* (2013.01); *H01L 2924/1432* (2013.01); *H01L 2924/1434* (2013.01); *H01L 2924/18162* (2013.01)

(58) Field of Classification Search
CPC .......... H01L 21/563; H01L 21/565; H01L 21/76879; H01L 21/568; H01L 21/4825; H01L 21/56; H01L 21/76895; H01L 23/3114; H01L 23/367; H01L 23/3675; H01L 23/49811; H01L 23/49827; H01L 23/49838; H01L 23/5226; H01L 23/3128; H01L 23/49816; H01L 23/5383; H01L 23/5385; H01L 23/5389; H01L 23/538; H01L 24/03; H01L 24/09; H01L 24/11; H01L 24/17; H01L 24/19; H01L 24/20
See application file for complete search history.

(56) References Cited

U.S. PATENT DOCUMENTS

| | | |
|---|---|---|
| 8,361,842 B2 | 1/2013 | Yu et al. |
| 8,680,647 B2 | 3/2014 | Yu et al. |
| 8,703,542 B2 | 4/2014 | Lin et al. |
| 8,759,964 B2 | 6/2014 | Pu et al. |
| 8,778,738 B1 | 7/2014 | Lin et al. |
| 8,785,299 B2 | 7/2014 | Mao et al. |
| 8,803,306 B1 | 8/2014 | Yu et al. |
| 8,809,996 B2 | 8/2014 | Chen et al. |
| 8,829,676 B2 | 9/2014 | Yu et al. |
| 8,877,554 B2 | 11/2014 | Tsai et al. |
| 8,937,381 B1 * | 1/2015 | Dunlap ............ H01L 24/19 257/784 |
| 9,478,504 B1 | 10/2016 | Shen et al. |
| 9,627,365 B1 | 4/2017 | Yu et al. |
| 9,659,907 B2 | 5/2017 | Zhai et al. |
| 10,217,724 B2 | 2/2019 | Lin et al. |
| 10,734,358 B2 * | 8/2020 | Rosch ............... H01L 24/96 |
| 11,862,610 B2 * | 1/2024 | Chang ............... H01L 24/96 |
| 2002/0149098 A1 | 10/2002 | Seyama et al. |
| 2003/0057575 A1 | 3/2003 | Gektin |
| 2003/0146507 A1 * | 8/2003 | Zhou ............ H01L 23/36 257/E23.101 |
| 2007/0075413 A1 * | 4/2007 | Egawa ........... H01L 21/6835 257/E21.705 |
| 2007/0230130 A1 | 10/2007 | Alcoe et al. |
| 2009/0039523 A1 | 2/2009 | Jiang et al. |
| 2010/0140779 A1 * | 6/2010 | Lin ............... H01L 23/49827 257/690 |
| 2010/0213600 A1 | 8/2010 | Lau et al. |
| 2010/0290191 A1 | 11/2010 | Lin et al. |
| 2011/0291288 A1 | 12/2011 | Wu et al. |
| 2011/0304036 A1 | 12/2011 | Son |
| 2013/0026468 A1 | 1/2013 | Yoshimuta et al. |
| 2013/0062760 A1 | 3/2013 | Hung et al. |
| 2013/0062761 A1 | 3/2013 | Lin et al. |
| 2013/0105991 A1 | 5/2013 | Gan et al. |
| 2013/0122659 A1 | 5/2013 | Wu et al. |
| 2013/0168848 A1 | 7/2013 | Lin et al. |
| 2013/0307140 A1 | 11/2013 | Huang et al. |
| 2014/0091461 A1 | 4/2014 | Shen |
| 2014/0185264 A1 | 7/2014 | Chen et al. |
| 2014/0203429 A1 | 7/2014 | Yu et al. |
| 2014/0225222 A1 | 8/2014 | Yu et al. |
| 2014/0252646 A1 | 9/2014 | Hung et al. |
| 2014/0264590 A1 | 9/2014 | Yu et al. |
| 2014/0353838 A1 * | 12/2014 | Lin ............... H01L 23/055 257/773 |
| 2015/0206854 A1 | 7/2015 | Lane et al. |
| 2015/0235993 A1 | 8/2015 | Cheng et al. |
| 2015/0303174 A1 | 10/2015 | Yu et al. |
| 2016/0260695 A1 * | 9/2016 | Chung ............... H01L 25/50 |
| 2016/0315071 A1 | 10/2016 | Zhai et al. |
| 2017/0062394 A1 | 3/2017 | Lin et al. |
| 2017/0092619 A1 | 3/2017 | Refai-Ahmed et al. |
| 2017/0287807 A1 | 10/2017 | Fain et al. |
| 2018/0068979 A1 * | 3/2018 | Lee ............... H01L 24/20 |

* cited by examiner

MULTI-DIE PACKAGE STRUCTURES INCLUDING REDISTRIBUTION LAYERS

PRIORITY CLAIM AND CROSS-REFERENCE

This is a divisional of U.S. patent application Ser. No. 15/706,141, filed on Sep. 15, 2017, which is a divisional of Ser. No. 14/927,218, filed on Oct. 29, 2015, now U.S. Pat. No. 9,768,145, issued Sep. 19, 2017, which claims the benefit of U.S. Provisional Application No. 62/212,375, filed on Aug. 31, 2015, which applications are hereby incorporated herein by reference.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semi-conductive layers of material over a semiconductor substrate, and patterning the various material layers using lithography to form circuit components and elements thereon. Dozens or hundreds of integrated circuits are typically manufactured on a single semiconductor wafer. The individual dies are singulated by sawing the integrated circuits along scribe lines. The individual dies are then packaged separately, in multi-chip modules, or in other types of packaging.

The semiconductor industry has experienced rapid growth due to continuous improvement in the integration density of a variety of electronic components (e.g., transistors, diodes, resistors, capacitors, etc.). For the most part, this improvement in integration density has come from repeated reductions in minimum feature size (e.g., shrinking the semiconductor process node towards the sub-20 nm node), which allows more components to be integrated into a given area. As the demand for miniaturization, higher speed, and greater bandwidth, as well as lower power consumption and latency has grown recently, there has grown a need for smaller and more creative packaging techniques for semiconductor dies.

As semiconductor technologies further advance, stacked semiconductor devices, e.g., three dimensional integrated circuits (3DICs), have emerged as an effective alternative to further reduce the physical size of semiconductor devices. In a stacked semiconductor device, active circuits such as logic, memory, processor circuits, and the like are fabricated on different semiconductor wafers. Two or more semiconductor wafers may be installed or stacked on top of one another to further reduce the form factor of the semiconductor device. Package-on-package (POP) devices are one type of 3DIC wherein dies are packaged and are then packaged together with another packaged die or dies.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
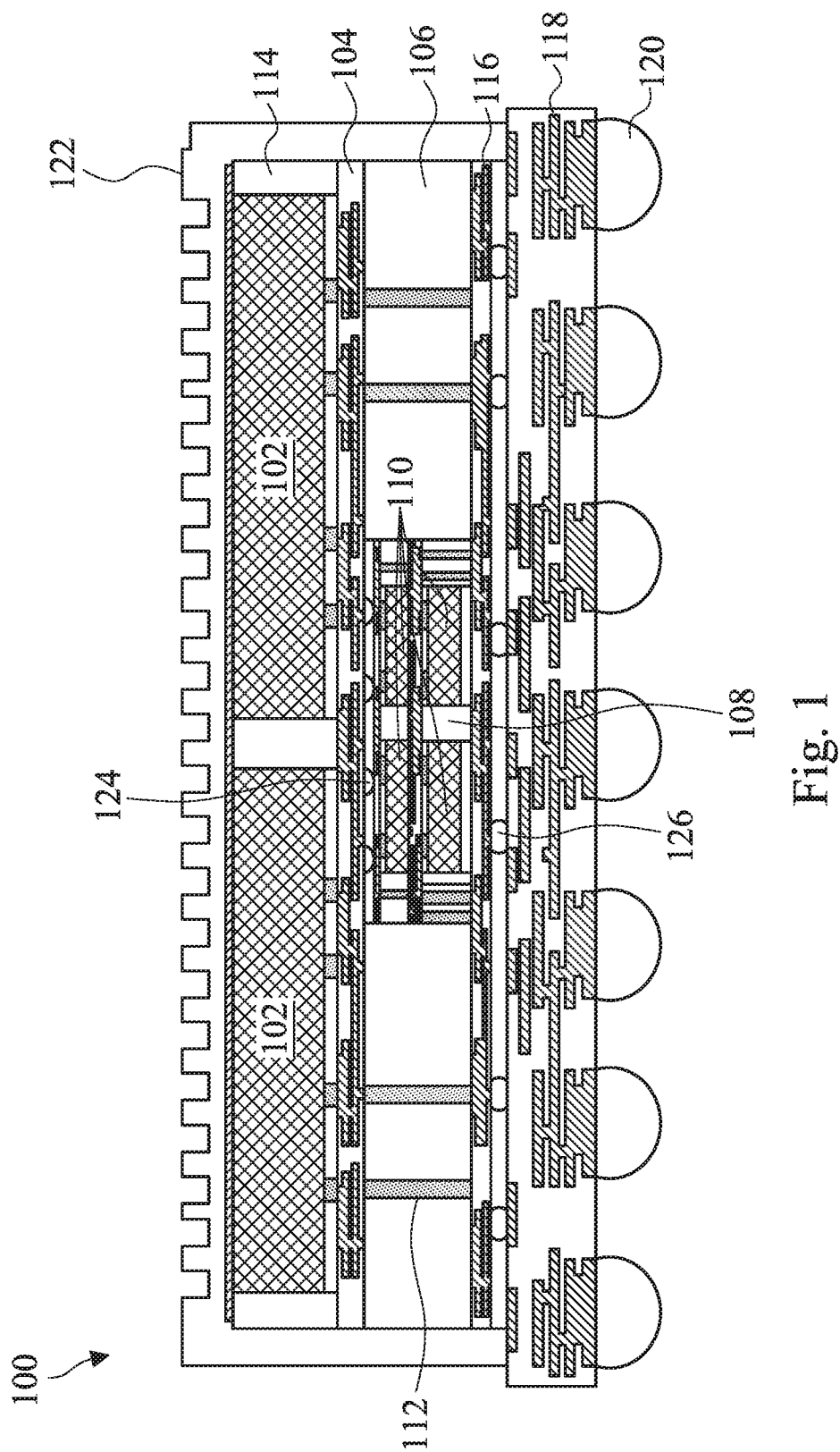
FIGS. 1 to 3 and 4A-4E are cross sectional and plan views of package structures according to exemplary embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. Similarly, terms such as "front side" and "back side" may be used herein to more easily identify various components, and may identify that those components are, for example, on opposing sides of another component. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments discussed herein may be discussed in a specific context, namely packages comprising logic dies and memory dies, or dies and interposers, on opposite sides of a redistribution layer and interconnected in a face-to-face orientation. Other embodiments contemplate other applications, such as different package types or different configurations that would be readily apparent to a person of ordinary skill in the art upon reading this disclosure. It should be noted that embodiments discussed herein may not necessarily illustrate every component or feature that may be present in a structure. For example, multiples of a component may be omitted from a figure, such as when discussion of one of the component may be sufficient to convey aspects of the embodiment. Further, method embodiments discussed herein may be discussed as being performed in a particular order; however, other method embodiments may be performed in any logical order.

FIG. 1 depicts a cross section of a package structure 100 according to some embodiments. Certain embodiments of package structure 100, with stacked memory in a face-to-face connection with logic dies through a redistribution layer, may be useful in high performance applications requiring high speed access to memory, such as, for example, a personal computer, a notebook, a tablet, a storage data center, or applications involving large scale databases and/or analytics, such as finance, life sciences, weather simulation, video coding, and/or seismic imaging. Many other applications are possible. Additionally, package structure 100 may be assembled as described herein in a manner that, when compared to other methods of manufacturing such high performance system-in-package structures, is cost effective and provides higher manufacturing yields. Moreover, the connections between components in the package structure 100 and external connections to the package structure 100 may have increased reliability compared to some other such high performance system-in-package structures.

The package structure 100 comprises one or more logic dies 102. Two logic dies 102 are depicted in FIG. 1, although more or less are possible according to the particular design. Logic dies 102 may comprise one or more central processing units (CPUs), network processor, FPGAs, GPUs, and/or ASICs in some embodiments. Logic dies 102 are encased in molding material 114 and disposed on a redistribution layer (RDL) 104. RDL 104, in turn, is disposed on molding material 106, which is, in turn, disposed on an RDL 116. Through vias 112 penetrate through molding material 106, connecting RDL 104 to RDL 116. A stacked memory structure 108 is disposed in molding material 106, between RDL 104 and RDL 116, and is positioned so that it underlies both logic dies 102 in part. Stacked memory structure 108 is connected to RDL 104 by interconnect structure 124, which may enable u-bump flip chip and/or metal-metal, polymer-polymer hybrid bonding. Stacked memory structure 108 communicates with logic dies 102 through interconnect structure 124, RDL 104, RDL 116 and through vias 112. In some embodiments, this design, with stacked memory structure 108 in a face-to-face connection with logic dies 102 through RDL 104 and interconnect structure 124, using u-bump flip chip and/or metal-metal, polymer-polymer hybrid bonding, which in some embodiments may allow for high density connections, and utilizing multi layers of fan-out technology such as RDL 104, RDL 116, and RDLs internal to stacked memory structure 108, may allow for reliable and high performance connections between logic dies 102 and stacked memory structure 108.

Stacked memory structure 108 in FIG. 1 comprises four memory dies 110, although more or less memory dies 110 may be used, depending on the design of the particular package structure. The stacked memory may comprise memories suitable for providing rapid access to data and data storage, such as DRAM, SRAM, SDRAM, and/or NAND memory. In the embodiment depicted in FIG. 1, one set of two memory dies 110 are positioned side by side, encased in molding material, and connected to an overlying RDL and an underlying RDL. Through vias penetrate through the molding material, connecting an overlying RDL to an underlying RDL. Two layers of memory dies 110, through vias, RDLs, and molding material are depicted in the stacked memory structure 108 of FIG. 1, although more or less layers may be used according to the particular approach. Each layer of memory dies 110 is connected to another layer of memory dies 110 using fan-out redistribution layers, allowing for greater flexibility in placement of connections that would otherwise be possible in light of the contacts in memory dies 110. Stacked memory structure 108 is connected to RDL 104 via interconnect structure 124 by u-bump flip chip bonding and/or metal-metal, polymer-polymer hybrid bonding. In some embodiments, interconnect structure 124 may provide a high density of connections to stacked memory structure 108.

RDL 116, underlying stacked memory structure 108, is connected to substrate 118 by connectors 126. In some embodiments, connectors 126 comprise connectors suitable for use with C4 flip chip bonding. Substrate 118 may provide increased mechanical support to package structure 100 in addition to providing an increased area for external electrical connection. Substrate 118 has a plurality of connectors 120 for external electrical connection on an opposite surface of substrate 118 from RDL 116. Finally, a heat dissipation lid 122 is disposed on substrate 118, with logic dies 102 and memory structure 108 disposed in an inner cavity of the heat dissipation lid 122. Heat dissipation lid 122 may provide physical protection to package structure 100 in addition to providing heat dissipation.

Figure 2:
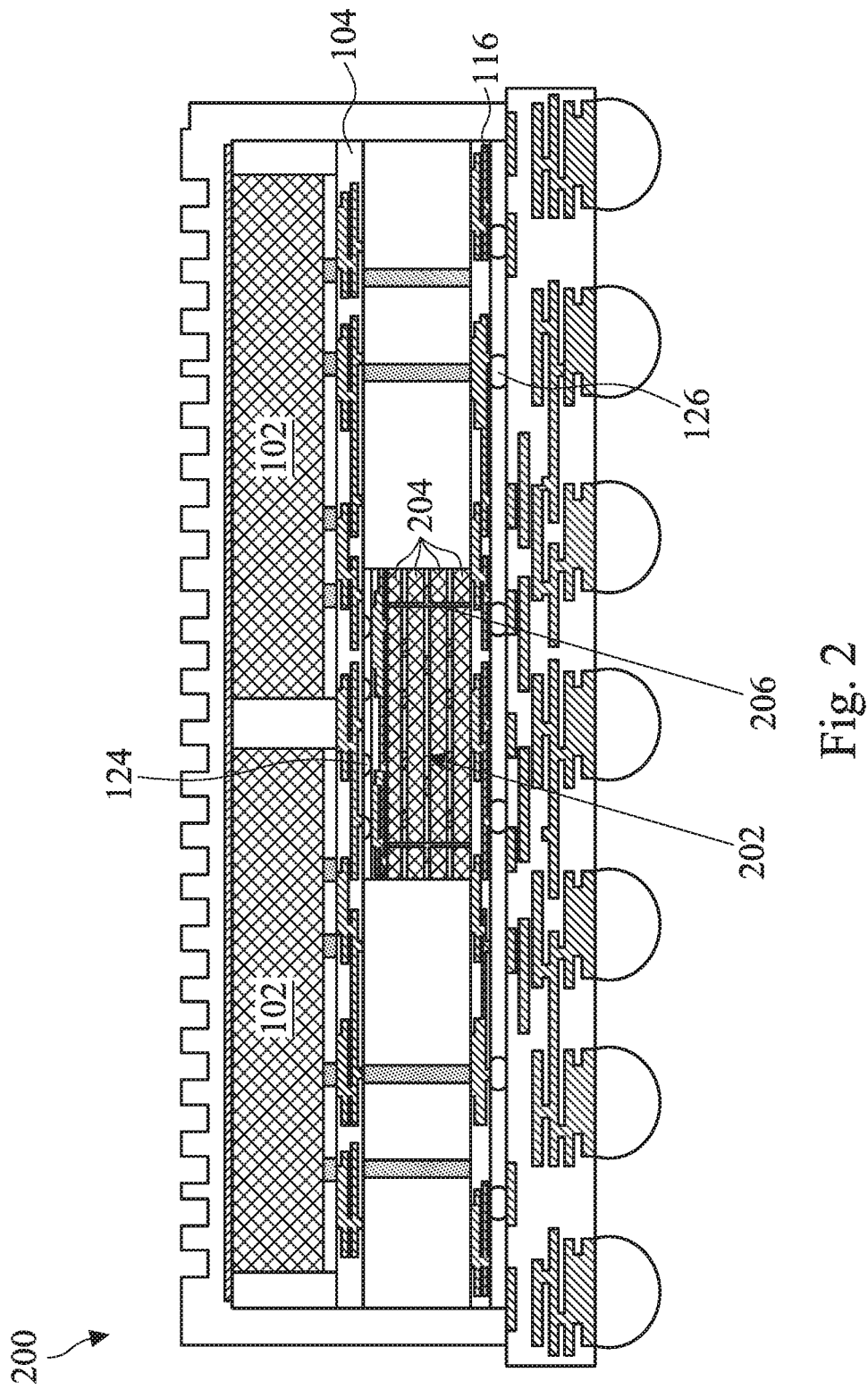

FIG. 2 depicts a cross section of a package structure 200 according to some embodiments. Package structure 200 is similar in many respects to package structure 100, depicted in FIG. 1. However, memory structure 108 is replaced in package structure 200 with memory structure 202. Memory structure 202 comprises four memory dies 204, although more or less may be used depending on the design. Memory dies 204 of memory structure 202 are stacked vertically, and connected by through vias 206 and/or connectors (not shown) disposed underneath the dies 204. In some embodiments, faster inter-memory communication may be achieved by memory structure 202, which in turn may improve data bandwidth and enable faster data access and data storage. Further, compared to stacked memory structure 108, stacked memory structure 202 is smaller, leaving additional room for through vias 112. On the other hand, stacked memory structure 202 may be thicker than stacked memory structure 108, in a height direction. Design considerations may therefore limit the number of memory dies 204 in stacked memory structure 202.

Stacked memory structure 202 is positioned in a face-to-face connection with logic dies 102 through interconnect structure 124. As described above, interconnect structure 124 may comprise u-bump flip chip bonding and/or metal-metal, polymer-polymer hybrid bonding. Memory dies 204 may be connected to each other using wafer-on-wafer hybrid bonding, polymer bonding, and/or u-bump flip chip bonding. Through vias 206 penetrate through the memory dies 204, allowing for electrical connections to logic dies 102 and/or RDL 116.

Figure 3:
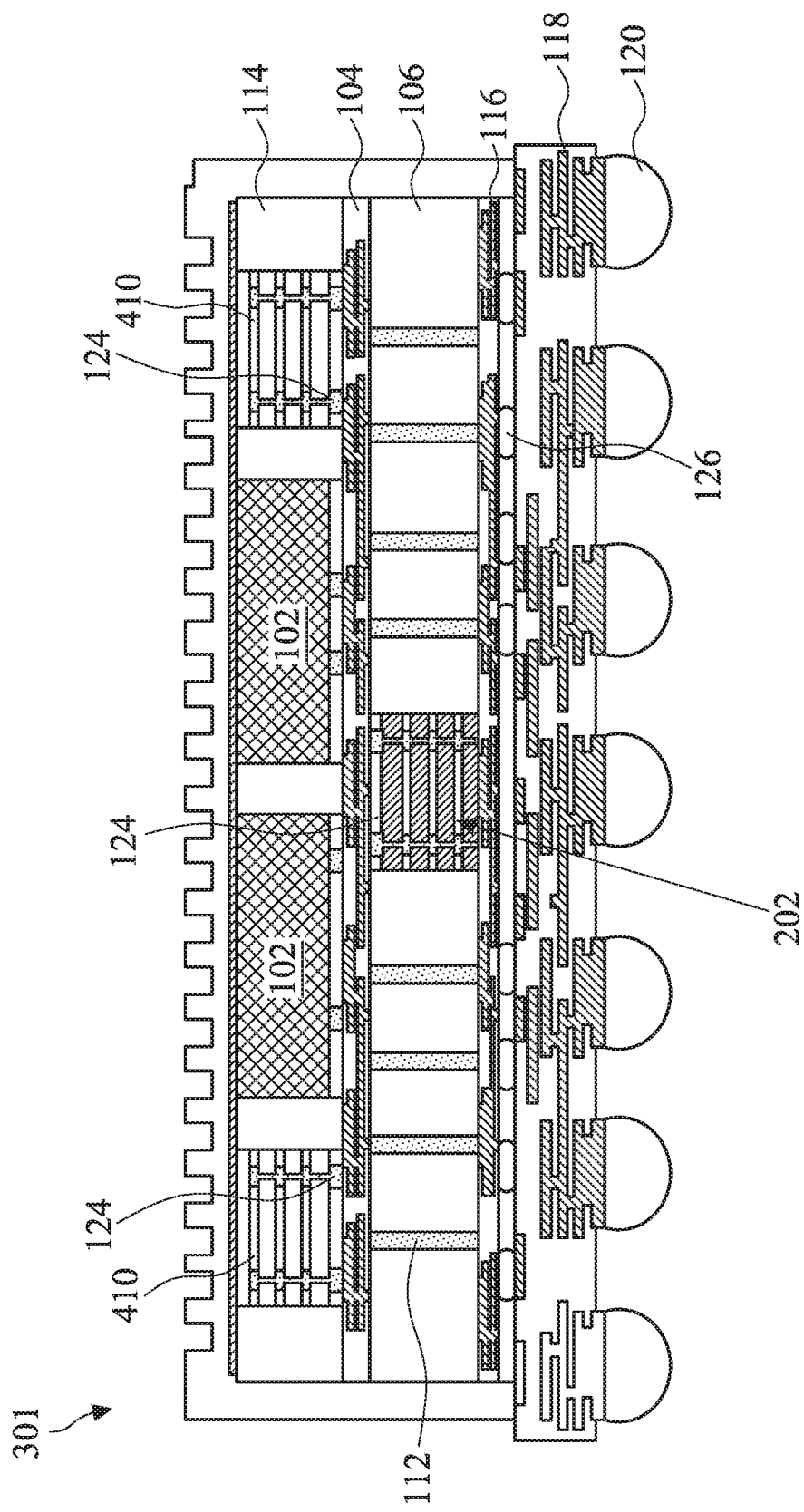

FIG. 3 depicts a cross section of a package structure 301 according to some embodiments. Package structure 301 is similar in many respects to package structures 100 and 200, depicted in FIGS. 1 and 2 respectively. Package structure 301 comprises a first stacked memory structure 202 disposed in molding material 106, between RDL 104 and RDL 116. In some embodiments, stacked memory structure 108 (shown in FIG. 1), with layers of dies in a side by side configuration, may also be suitable for use with package structure 301, depending on the particular design. Memory structure 202 is in a face-to-face connection with logic dies 102 through interconnect structure 124 and RDL 104. Package 301 further comprises a plurality of stacked memory structures 410, which are disposed in molding material 114 and connected to RDL 104 through interconnect structures 124. As described above, in some embodiments interconnect structures 124 may comprise u-bump flip chip bonding and/or metal-metal, polymer-polymer hybrid bonding. In the embodiment depicted in FIG. 3, there are two stacked memory structures 410, each disposed on RDL 104 between a respective logic die 102 and the outside of the package. Logic dies 102 communicate with memory structures 410 through RDL 104 and interconnect structures 124.

In some embodiments that comprise memory structure 202 (or memory structure 108) and memory structures 410, memory structure 202 may comprise a type of memory that is suitable for rapid data access applications. For example, in some embodiments, memory structure 202 may comprise SRAM. In some embodiments, memory structures 410 comprise HBM (High Bandwidth Memory). For example, memory structures 410 may comprise a plurality of DRAM dies, vertically stacked together, with through vias and u-bumps under the DRAM dies vertically interconnecting the DRAM dies. In some embodiments, the bottom die of memory structure 410 may comprise an interface controller die, which may help to manage data storage and data format interoperability between the respective memory structure 410 and external devices. Memory structure 410 may also include SRAM, SDRAM, NAND, or the like, depending on the particular design. In some embodiments, package structure 301 may provide high bandwidth data communication between logic dies 102 and memory structure 410.

Figure 4A:
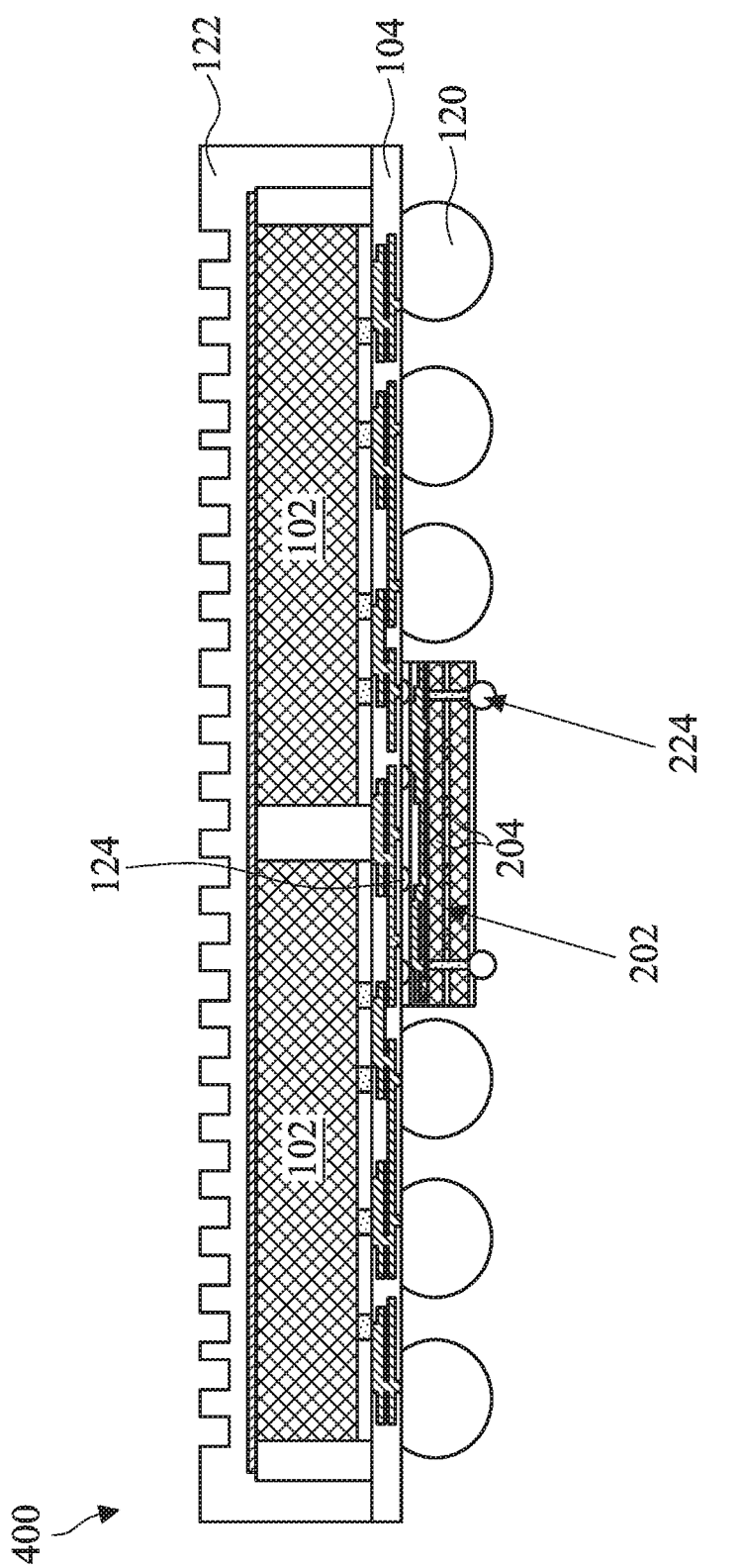

FIG. 4A depicts a cross section of a package structure 400 according to some embodiments. In some embodiments, the stacked memory structure under RDL 104, depicted in FIGS. 1-3 as stacked memory structure 108 or stacked memory structure 202, respectively, may comprise fewer dies and/or thinner dies, such that the stacked memory structure become thinner. If a stacked memory structure becomes sufficiently thin, determined by the design of the particular package, a simplified package structure, such as the package structure 400 illustrated in FIG. 4, may be realized. Compared to packages structures 100, 200, and 301, package structure 400 has no molding material 106, through vias 112, RDL 116, connectors 126, or substrate 118. Package structure 400 may provide a lower cost and thinner profile, compared to some other embodiments discussed herein.

Figure 4B:
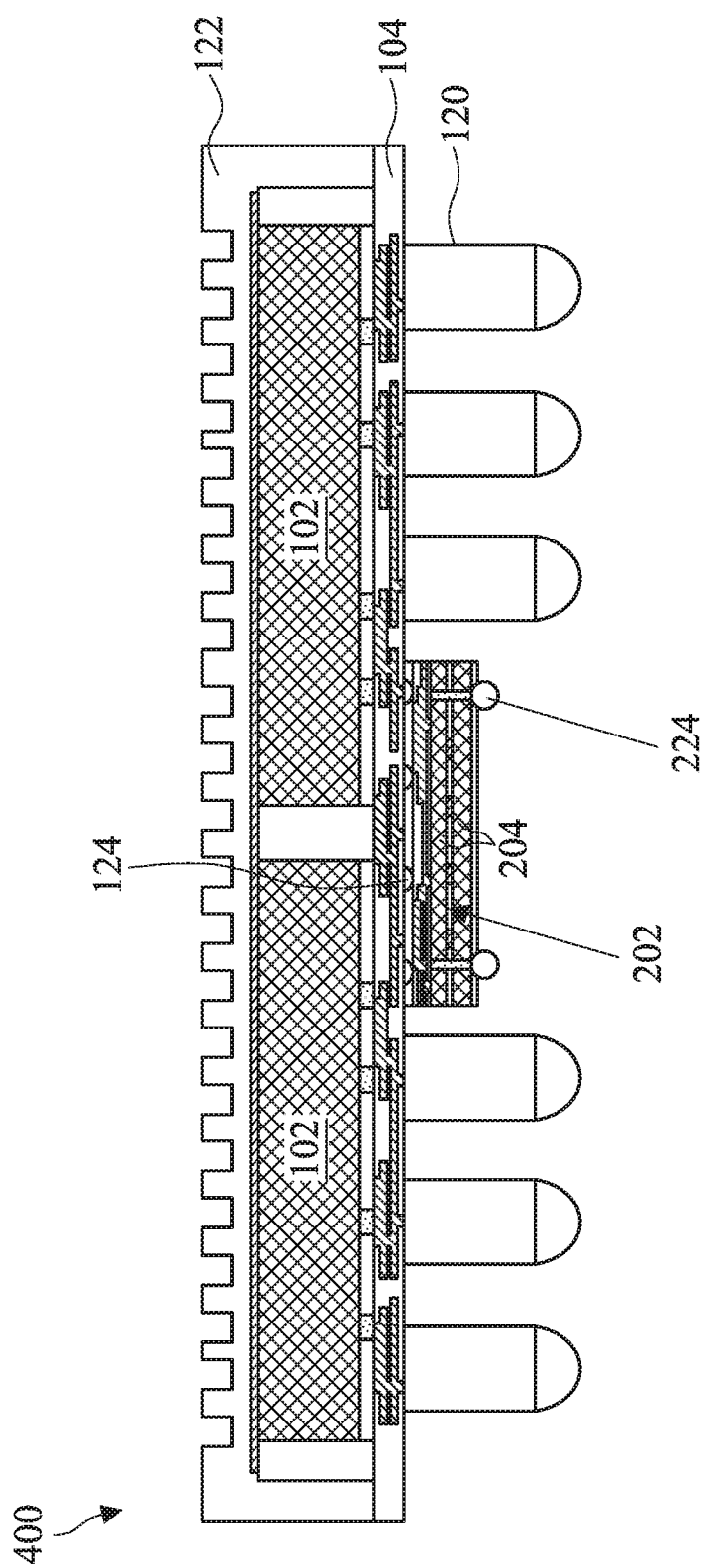

In some embodiments, the bottom side of memory structure 202 may include connectors 224, such as a solder ball, solder bump, and/or a metal pad, or the like, to connect to a substrate. Connectors 224 may additionally provide additional thermal dissipation to memory structure 202. In some embodiments, connectors 120 may include solder balls arranged as a ball grid array (BGA). Referring to FIG. 4B, in some embodiments connectors 120 may comprise copper pillars with a solder cap on each pillar. In some embodiments, copper pillars with a solder cap on each pillar may help to compensate for the increase in thickness caused by stacked memory structure 202. Connectors 120 and connectors 224 may comprise copper, nickel, solder, a combination of these materials, or the like.

Figure 4C:
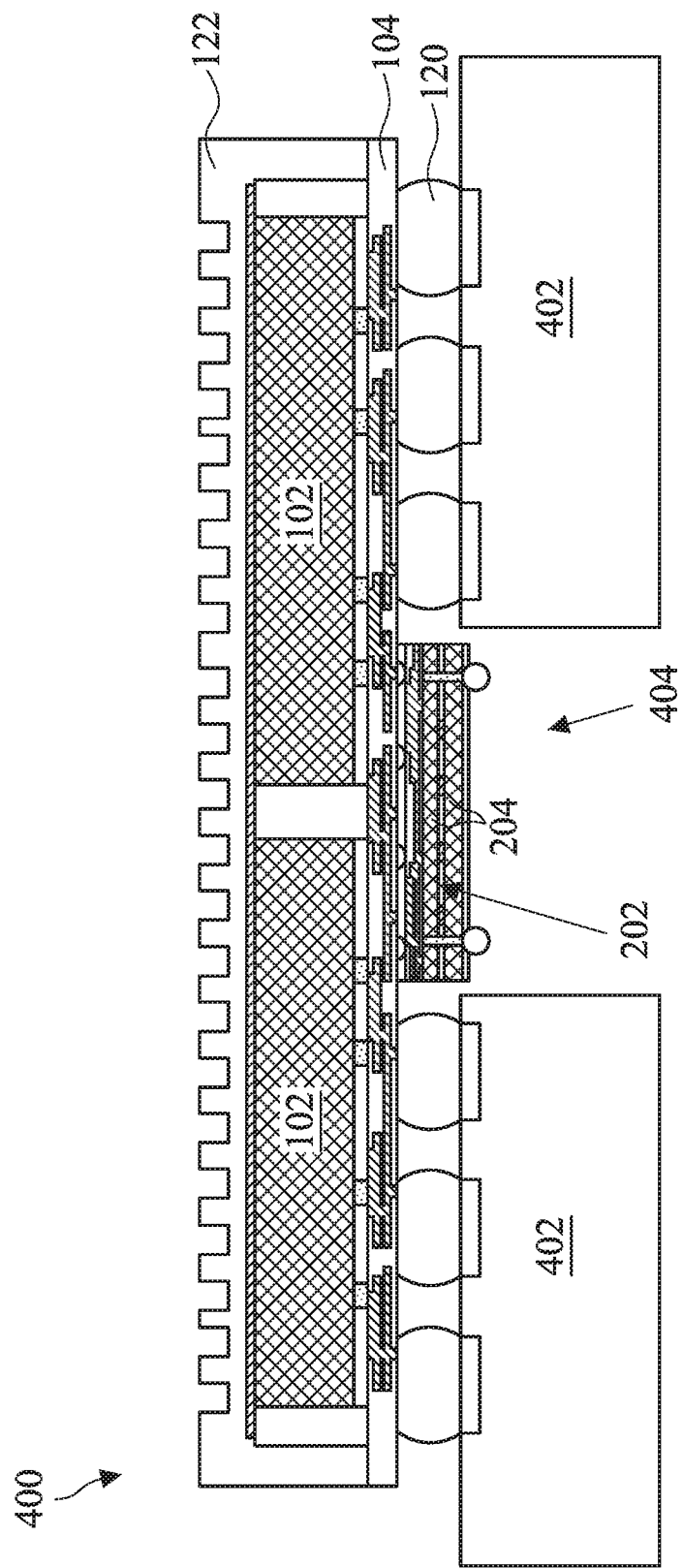
Figure 4D:
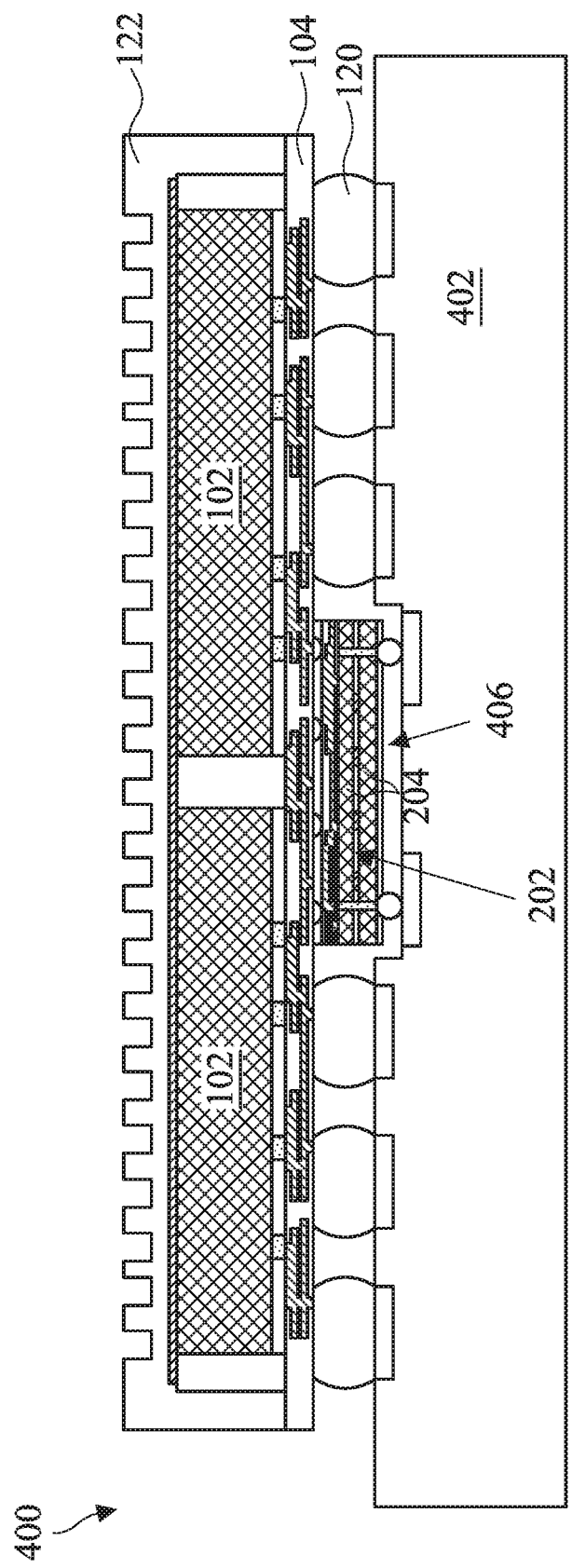
Figure 4E:
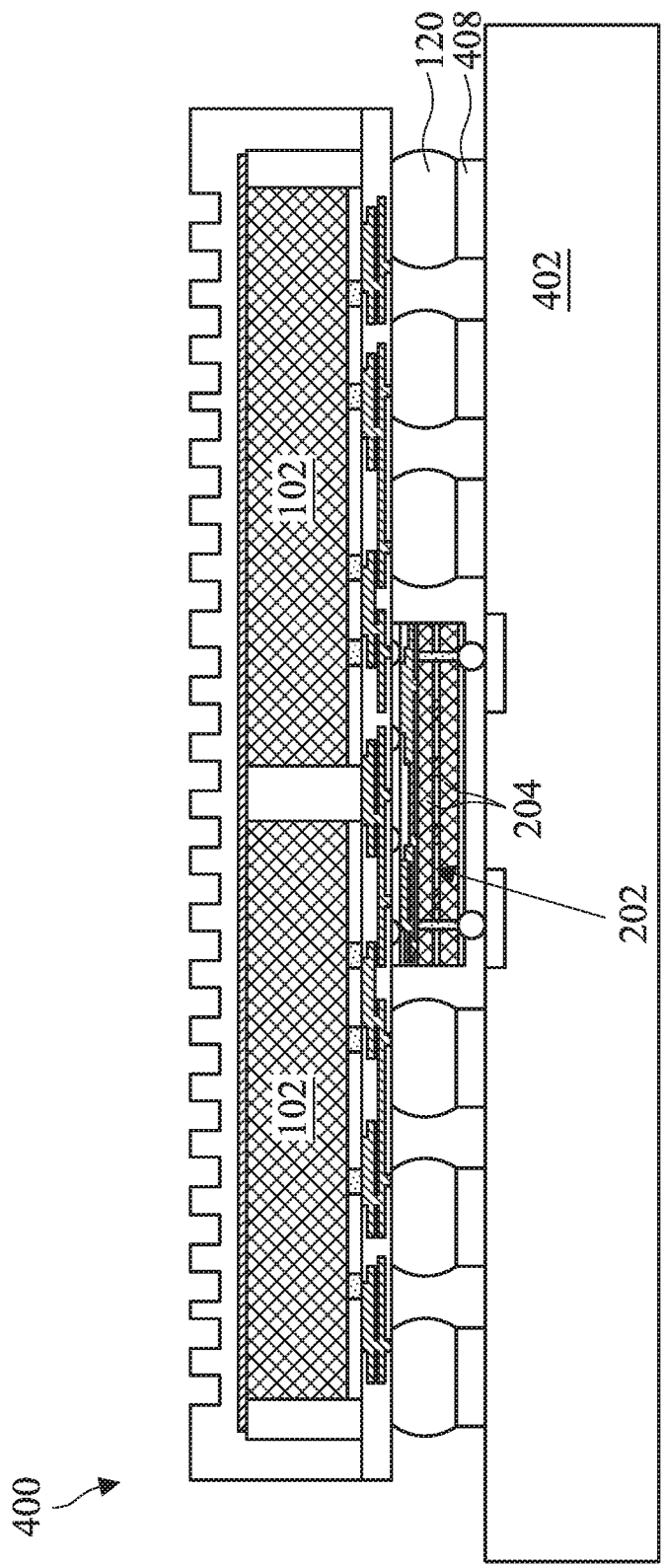

Referring to FIG. 4C, in some embodiments, package 400 may connect to a substrate 402, such as a printed circuit board (PCB), using connectors 120. In some embodiments, the substrate 402 may contain a cavity 404 that is positioned underneath stacked memory structure 202 to accommodate the increase in thickness due to the stacked memory structure 202. In some embodiments, as shown in FIG. 4D, substrate 402 may instead have a partial cavity 406 positioned underneath stacked memory structure 202 to accommodate the increase in thickness due to the stacked memory structure 202. Referring to FIG. 4E, in some embodiments, substrate 402 may include a plurality of copper pillars 408 on the surface of the substrate 402 that faces the package 400. The copper pillars 408 connect to connectors 120 on package 400. In some embodiments, copper pillars 408 may help to compensate for the increase in thickness due to the stacked memory structure 202.

Figure 5:
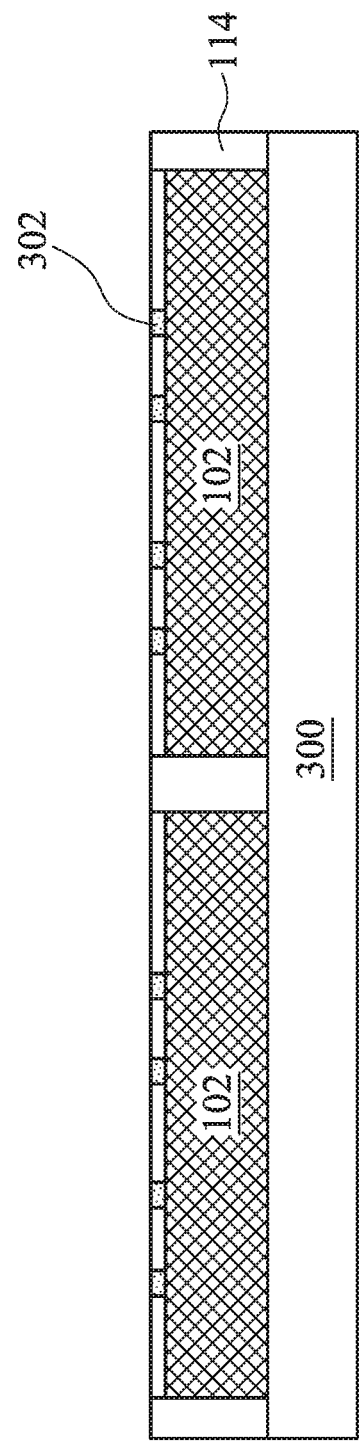
FIGS. 5 to 12 are cross sections of intermediate stages in the making of package structures according to exemplary embodiments.

FIGS. 5-13 illustrate cross-sectional views of intermediate steps in forming a package structure in accordance with some embodiments. Referring first to FIG. 5, there is shown a carrier substrate 300. Generally, the carrier substrate 300 provides temporary mechanical and structural support during subsequent processing steps. The carrier substrate 300 may include any suitable material, such as, for example, silicon based materials, such as a silicon wafer, glass or silicon oxide, or other materials, such as aluminum oxide, a ceramic material, combinations of any of these materials, or the like. In some embodiments, the carrier substrate 300 is planar in order to accommodate further processing.

Logic dies 102 are placed over the carrier substrate 300. Logic dies 102 may include any kind of logic or processing die suitable for a particular approach, such as a CPU, a GPU, an ASIC, an FPGA, a network processor, a combination thereof, or the like. Although two logic dies 102 are depicted in FIG. 5, more or less is possible, depending on the particular design. Logic dies 102 may be attached to carrier substrate 300 by an adhesive layer (not shown), such as a die-attach film (DAF). Logic dies 102 may be attached to any suitable location of carrier substrate 300 for a particular design or application. Logic dies comprise metal contacts 302 on a surface of the die that faces away from the carrier substrate 300. Metal contacts 302 allow logic dies 102 to electrically connect to external components, packages devices, and the like. To enhance the reliability of metal contacts 302, a thin layer of polymer dielectric material (not shown) may be optionally applied to the surface of logic dies 102, in which case the metal contacts 302 are embedded within the polymer dielectric material. In some embodiments, such as the package structure 301 illustrated in FIG. 3, memory structures 410 may also be placed over the carrier substrate 300 and attached to the carrier substrate using the same processes as described above for logic dies 102.

Next, molding material 114 is molded on logic dies 102. Molding material 114 fills the gaps between dies. Molding material 114 may include a molding compound, a molding underfill, an epoxy, or a resin. On application, the top surface of molding material 114 is higher than the top ends of metal contacts 302. A grinding step is performed to thin molding material 114, until metal contacts 302 in logic dies 102 are exposed. The resulting structure is shown in FIG. 5. Due to the grinding, the top ends of the metal contacts 302 in logic dies 102 are substantially level (coplanar) with the top ends of molding material 114. As a result of the grinding, metal residues such as metal particles may be generated, and left on the top surfaces. Accordingly, after the grinding, a cleaning may be performed, for example, through a wet etching, so that the metal residue is removed.

Figure 6:
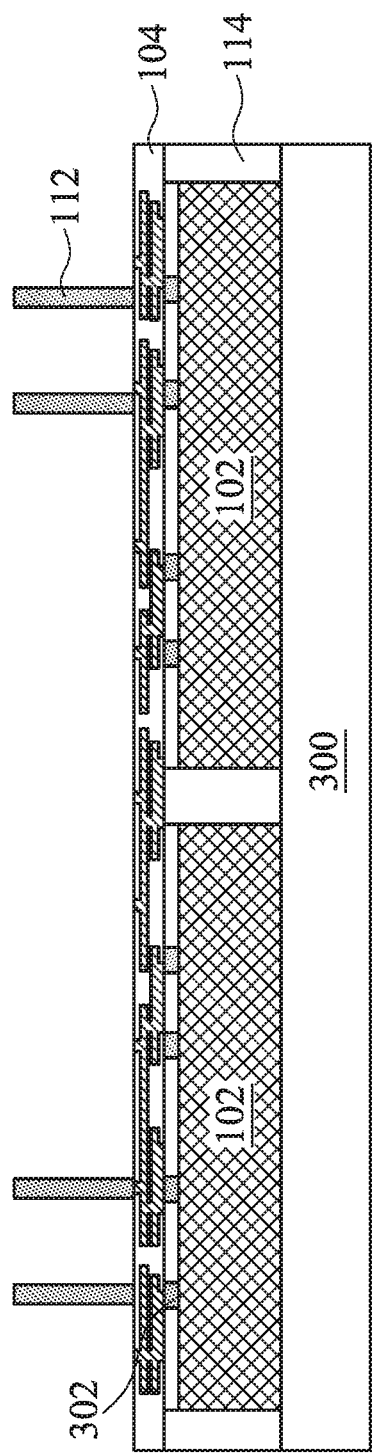

Referring to FIG. 6, a layer of RDL 104 is formed over the molding material 114. Generally, RDLs provide a conductive pattern that allows a pin-out contact pattern for a package that is different than the pattern of the metal contacts 302 on the dies 102, allowing for greater flexibility in the placement of dies 102. The RDLs may be utilized to provide an external electrical connection to dies 102, or to electrically couple dies 102 to one or more other packages, package substrates, components, the like, or a combination thereof. The RDLs comprise conductive lines and via connections, wherein via connections connect an overlying conductive line to an underlying conductive feature.

The RDLs may be formed using any suitable process. For example, in some embodiments, a first dielectric layer is formed on the molding material 114 and dies 102. In some embodiments, the first dielectric layer is formed of a polymer, which may be a photo-sensitive material such as polybenzoxazole (PBO), polyimide, benzocyclobutene (BCB), or the like, that may be patterned using lithography.

In other embodiments, the first dielectric layer is formed of a nitride such as silicon nitride, an oxide such as silicon oxide, PhosphoSilicate Glass (PSG), BoroSilicate Glass (BSG), Boron-doped PhosphoSilicate Glass (BPSG), or the like. The first dielectric layer may be formed by spin coating, lamination, CVD, the like, or a combination thereof. The first dielectric layer is then patterned to form openings to expose metal contacts 302 in logic dies 102. In embodiments in which the first dielectric layer is formed of a photosensitive material, the patterning may be performed by exposing the first dielectric layer in accordance with a desired pattern and developed to remove the unwanted material, thereby exposing the metal contacts 302. Other methods, such as using a patterned mask and etching, may also be used to pattern the first dielectric layer.

Next, a seed layer (not shown) is formed over the first dielectric layer and in the openings formed in the first dielectric layer. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD, or the like. A mask is then formed and patterned on the seed layer in accordance with a desired redistribution pattern. In some embodiments, the mask is a photoresist formed by spin coating or the like and exposed to light for patterning. The patterning forms openings through the mask to expose the seed layer. A conductive material is formed in the openings of the mask and on the exposed portions of the seed layer. The conductive material may be formed by plating, such as electroplating or electroless plating, or the like. The conductive material may comprise a metal, like copper, titanium, tungsten, aluminum, or the like. Then, the photoresist and portions of the seed layer on which the conductive material is not formed, are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching. The remaining portions of the seed layer and conductive material form the conductive lines and via connections. A second dielectric layer is formed over the first dielectric layer to provide a more planar surface for subsequent layers and may be formed using similar materials and processes as used to form the first dielectric layer. In some embodiments, the second dielectric layer is formed of polymer, a nitride, an oxide, or the like. In some embodiments, the second dielectric layer is PBO formed by a spin-on process.

The above processes result in the formation of one layer of RDLs. The processes above may be repeated a number of times to form a plurality of RDL layers, depending on the particular approach.

RDL 104 may also be formed in alternative ways. For example, RDL 104 may be pre-formed directly over a first carrier substrate using, by fabrication tools, the same or similar processes to those described above. Logic dies 102, and, in some embodiments, memory structures 410, are bonded to RDL 104 using the same or similar processes to those described above. Next, molding material 114 is applied. The structure is next flipped and placed over a second carrier substrate, and the first substrate may be removed. The backside of the first substrate is thinned to expose metal connections in RDL 104. The thinning process may comprise, for example, a mechanical grinding step followed by a wet etching process and/or a chemical mechanical polishing process, or the like. Any suitable leveling process may be used.

Next, referring to FIG. 6, through vias 112 are formed over RDL 104. The through vias 112 provide an electrical connection from an RDL on one side of a molding compound to an RDL on the other side of the molding compound. For example, as will be explained in greater detail below, a stacked memory structure will be placed on RDL 104 and a molding compound will be formed around the through vias and the stacked memory structure. Subsequently, another layer of RDL will be formed overlying the through vias and the stacked memory structure. The through vias 112 provide an electrical connection through the molding compound between the overlying RDL and the underlying RDL without having to pass electrical signals through the stacked memory structure.

In some embodiments, through vias 112 may be formed directly on metal contacts 302 of logic dies 102, instead of being formed on RDL 104. In such embodiments, logic dies 102 may be specially designed to position metal contacts 302 underneath the planned locations of through vias 112. As such, RDL 104 may contain fewer RDL layers, or in some embodiments, RDL 104 may not be required, which may lower manufacturing costs.

Through vias 112 may be formed, for example, by forming a conductive seed layer (not shown) over RDL 104. In some embodiments, the seed layer is a metal layer, which may be a single layer or a composite layer comprising a plurality of sub-layers formed of different materials. The seed layer may be made of copper, titanium, nickel, gold, or a combination thereof, or the like. In some embodiments, the seed layer comprises a titanium layer and a copper layer over the titanium layer. The seed layer may be formed using, for example, physical vapor deposition (PVD), CVD, atomic layer deposition (ALD), a combination thereof, or the like. In some embodiments, the seed layer comprises a titanium layer and a copper layer over the titanium layer. In alternative embodiments, the seed layer is a copper layer.

Next, a mask layer, such as a patterned photoresist layer, may be deposited and patterned, wherein openings in the mask layer expose the seed layer. The openings may be filled with a conductive material using, for example, an electroless plating process or an electrochemical plating process, thereby creating the metal features that comprise through vias 112. The plating process may uni-directionally fill openings (e.g., from the seed layer upwards) in the patterned photoresist layer. Uni-directional filling may allow for more uniform filling of such openings. Alternatively, another seed layer may be formed on sidewalls of the openings in the patterned photoresist layer, and such openings may be filled multi-directionally. The metal features that are formed may comprise copper, aluminum, tungsten, nickel, solder, or alloys thereof. The top-view shapes of through vias 112, comprising the metal features and the underlying portions of the seed layer, may be rectangles, squares, circles, or the like. The heights of through vias 112 are determined by the thickness of the subsequently placed memory structure 108, with the heights of through vias 112 greater than the thickness of memory structure 108 in some embodiments.

Next, the mask layer may be removed, for example in an ashing and/or wet strip process. An etch step is performed to remove the exposed portions of the seed layer, wherein the etching may be an anisotropic etching. The portions of the seed layer that are part of the through vias 112 and overlapped by metal features, on the other hand, remain not etched. It is noted that, when the seed layer is formed of a material similar to or the same as the overlying metal features, the seed layer may be merged with the metal with no distinguishable interface between. In some embodiments, there exist distinguishable interfaces between the seed layer and the overlying metal features. The through vias 112 can also be realized with metal wire studs placed by a wire bonding process, such as a copper wire bonding process. The use of a wire bonding process may eliminate the need for depositing a seed layer, depositing and patterning a mask layer, and plating to form the through vias 112.

Figure 7:
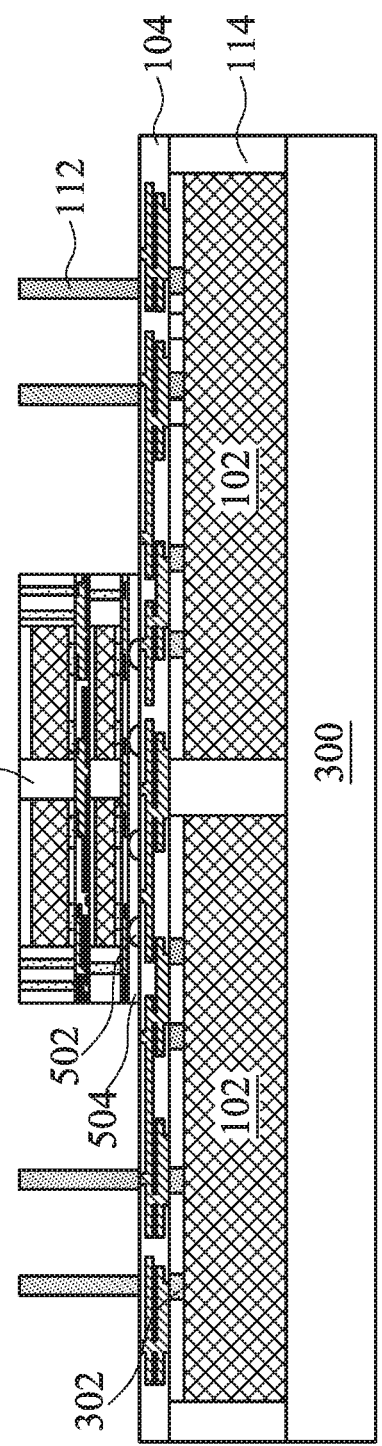

Next, referring to FIG. 7, memory structure 108 is bonded to RDL 104 through interconnect structure 124 so that it is in a face-to-face connection with logic dies 102 through RDL 104. Memory structure 108 is positioned so that it overlies both logic dies 102 in part, thereby minimizing the length of some of the connections between memory structure 108 and logic dies 102. The reduction in length of the connection paths may enable increased reliability in the connection paths.

Interconnect structure 124 may comprise one or more electrical connectors 502 on an underside of the structure. The connectors 502 may be solder balls, metal pillars, controlled collapse chip connection (C4) bumps, micro bumps, electroless nickel-electroless palladium-immersion gold technique (ENEPIG) formed bumps, combination thereof (e.g., a metal pillar having a solder ball attached thereof), or the like. The connectors 502 may include a conductive material such as solder, copper, aluminum, gold, nickel, silver, palladium, tin, the like, or a combination thereof. In some embodiments, the connectors 502 comprise a eutectic material and may comprise a solder bump or a solder ball, as examples. The solder material may be, for example, lead-based and lead-free solders, such as Pb—Sn compositions for lead-based solder; lead-free solders including InSb; tin, silver, and copper (SAC) compositions; and other eutectic materials that have a common melting point and form conductive solder connections in electrical applications. For lead-free solder, SAC solders of varying compositions may be used, such as SAC 105 (Sn 98.5%, Ag 1.0%, Cu 0.5%), SAC 305, and SAC 405, as examples. Lead-free connectors such as solder balls may be formed from SnCu compounds as well, without the use of silver (Ag). Alternatively, lead-free solder connectors may include tin and silver, Sn—Ag, without the use of copper. In some embodiments, a reflow process may be performed, giving the connectors 502 a shape of a partial sphere in some embodiments. Alternatively, the connectors 502 may comprise other shapes. The connectors 502 may also comprise non-spherical conductive connectors, for example. In some embodiments, the connectors 502 comprise metal pillars (such as a copper pillar) formed by a sputtering, printing, electro plating, electroless plating, CVD, or the like, with or without a solder material thereon. The metal pillars may be solder free and have substantially vertical sidewalls or tapered sidewalls.

An underfill material 504 may be injected or otherwise formed in the space between the connectors 502 and RDL 104. The underfill material 504 may, for example, comprise a liquid epoxy, non-conductive paste (NCP), non-conductive film (NCF), deformable gel, silicon rubber, or the like, that is dispensed between the connectors 502 and RDL 104 and/or pre-laminated on the surface of memory die, and then cured to harden. This underfill material 504 is used, among other things, to reduce cracking and to protect the connectors 502.

In some embodiments, interconnect structure 124 may bond memory structure 108 to RDL 104 using hybrid bonding. For example, a connector 502, comprising a metal, such as copper, may directly bond to a metal pad, in this case comprising copper, on RDL 104 through a metal-metal bond (in this case a Cu—Cu bond). Further, a pre-formed dielectric layer, in which connector 502 is embedded, may bond to a dielectric layer on a top surface of RDL 104 through a polymer-polymer bond. To form a hybrid bond, the surface roughness of the connector 502, the preformed dielectric layer, the dielectric on the top surface of RDL 104, and the copper pad of RDL 104 must be controlled, for example by a chemical mechanical polishing process. The dielectric materials may include oxide, SiN, SiON, and the like. The metal connections, for hybrid bonding, may comprise Cu—Cu, Au—Au, Cu—Sn—Cu, and the like. In some embodiments, hybrid bonding may enable connectors 502 to have a fine pitch, for example less than about 5 μm. As such, hybrid bonding may allow interconnect structure 124 to comprise a high density of connections between logic die 102 and memory structure 108.

Figure 8:
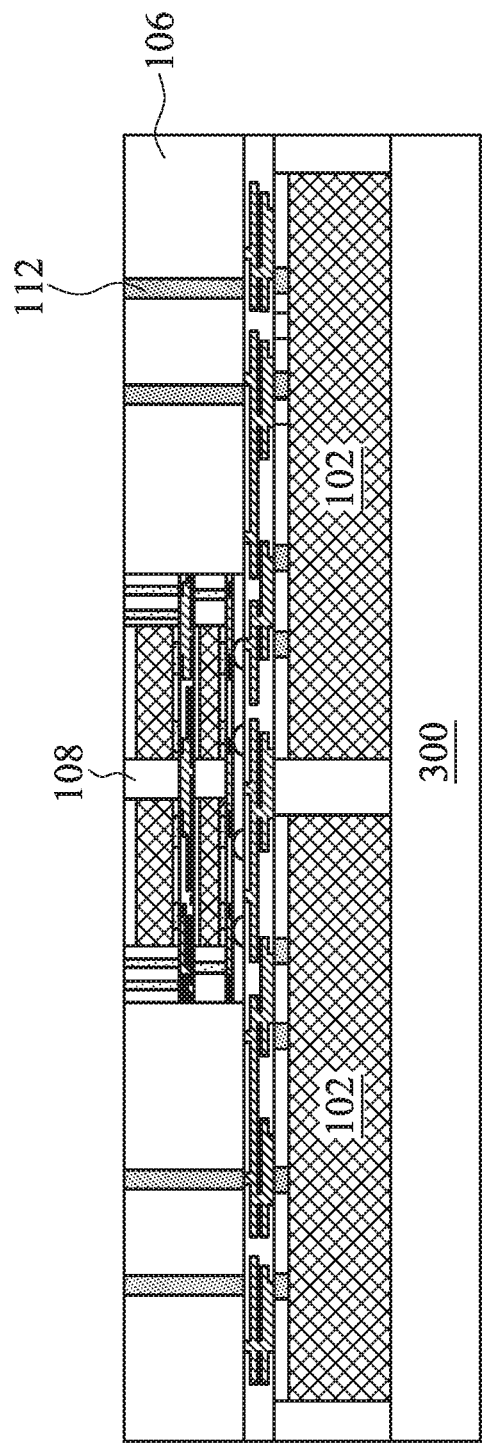

Next, referring to FIG. 8, molding material 106 is molded on through vias 112 and memory structure 108. Molding material 106 fills the gaps between the through vias 112 and memory structure 108. Molding material 106 may include a molding compound, a molding underfill, an epoxy, or a resin. The top surface of molding material 106 is higher than the top ends of through vias 112 and memory structure 108. A grinding step is performed to thin molding material 106, until through vias 112 and the through vias in memory structure 108 are exposed. The resulting structure is shown in FIG. 8. Due to the grinding, the top ends of the through vias 112 and the through vias in memory structure 108 are substantially level (coplanar) with the top ends of molding material 106. As a result of the grinding, metal residues such as metal particles may be generated, and left on the top surfaces. Accordingly, after the grinding, a cleaning may be performed, for example, through a wet etching, so that the metal residue is removed.

Figure 9:
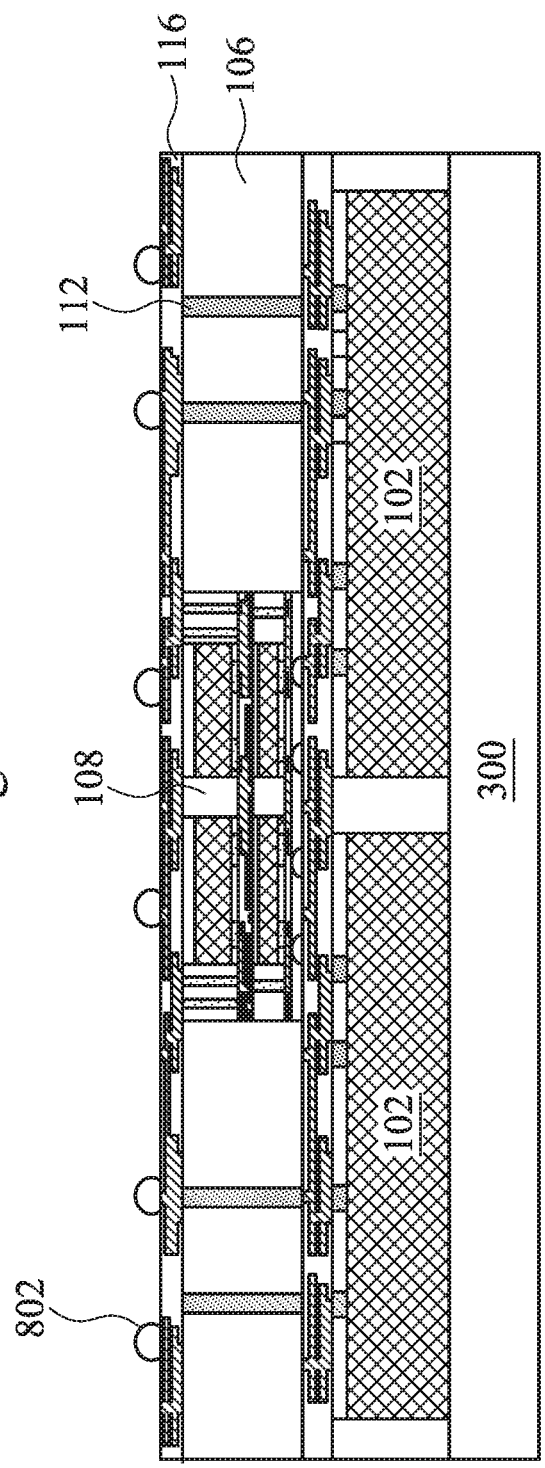

Referring to FIG. 9, a layer of RDL 116 is formed overlying molding material 106. RDL 116 may provide a conductive pattern that allows a pin-out contact pattern for the through vias 112 and the through vias comprised in stacked memory structure 108. In addition to providing electrical connection, RDL 116 may serve as an additional heat dissipation path to conduct heat from logic dies 102 and memory structure 108 to substrate 118 (described in detail below) through vias 112 and through vias comprised in memory structure 108. RDL 116 may be formed using similar processes as described above. For example, in some embodiments, a first dielectric layer is formed on the molding material 106. In some embodiments, the first dielectric layer is formed of a polymer, which may be a photo-sensitive material such as polybenzoxazole (PBO), polyimide, benzocyclobutene (BCB), or the like, that may be patterned using lithography. In other embodiments, the first dielectric layer is formed of a nitride such as silicon nitride, an oxide such as silicon oxide, PhosphoSilicate Glass (PSG), BoroSilicate Glass (BSG), Boron-doped PhosphoSilicate Glass (BPSG), or the like. The first dielectric layer may be formed by spin coating, lamination, CVD, the like, or a combination thereof. The first dielectric layer is then patterned to form openings to expose through vias 112 and the through vias in memory structure 108. In embodiments in which the first dielectric layer is formed of a photo-sensitive material, the patterning may be performed by exposing the first dielectric layer in accordance with a desired pattern and developed to remove the unwanted material, thereby exposing through vias 112 and the through vias in memory structure 108. Other methods, such as using a patterned mask and etching, may also be used to pattern the first dielectric layer.

Next, a seed layer (not shown) is formed over the first dielectric layer and in the openings formed in the first dielectric layer. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD, or the like. A mask is then formed and patterned on the seed layer in accordance with a desired redistribution pattern. In some embodiments, the mask is a photoresist formed by spin coating or the like and exposed to light for patterning. The patterning forms openings through the mask to expose the seed layer. A conductive material is formed in the openings of the mask and on the exposed portions of the seed layer. The conductive material may be formed by plating, such as electroplating or electroless plating, or the like. The conductive material may comprise a metal, like copper, titanium, tungsten, aluminum, or the like. Then, the photoresist and portions of the seed layer on which the conductive material is not formed, are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching. The remaining portions of the seed layer and conductive material form the conductive lines and via connections. A second dielectric layer is formed over the first dielectric layer to provide a more planar surface for subsequent layers and may be formed using similar materials and processes as used to form the first dielectric layer. In some embodiments, the second dielectric layer is formed of polymer, a nitride, an oxide, or the like. In some embodiments, the second dielectric layer is PBO formed by a spin-on process.

Although one layer of RDLs has been described, the processes above may be repeated a number of times to form a plurality of RDL layers, depending on the particular approach.

Next, connectors 802 are attached to RDL 116. Connectors 802 allow the structure to electrically couple to other packages, components, devices, substrates, the like, or a combination thereof. In some embodiment, connectors 802 may directly connect to through vias 112. In such embodiment, the RDL 116 is not required. This may help to lower manufacturing costs of the package. In such an embodiment, the package may be designed in a manner than the through vias 112 are disposed directly over a connector 802.

The connectors 802 may be solder balls, metal pillars, controlled collapse chip connection (C4) bumps, micro bumps, electroless nickel-electroless palladium-immersion gold technique (ENEPIG) formed bumps, combination thereof (e.g., a metal pillar having a solder ball attached thereof), or the like. The connectors 802 may include a conductive material such as solder, copper, aluminum, gold, nickel, silver, palladium, tin, the like, or a combination thereof. In some embodiments, the connectors 802 comprise a eutectic material and may comprise a solder bump or a solder ball, as examples. The solder material may be, for example, lead-based and lead-free solders, such as Pb—Sn compositions for lead-based solder; lead-free solders including InSb; tin, silver, and copper (SAC) compositions; and other eutectic materials that have a common melting point and form conductive solder connections in electrical applications. For lead-free solder, SAC solders of varying compositions may be used, such as SAC 105 (Sn 98.5%, Ag 1.0%, Cu 0.5%), SAC 305, and SAC 405, as examples. Lead-free connectors such as solder balls may be formed from SnCu compounds as well, without the use of silver (Ag). Alternatively, lead-free solder connectors may include tin and silver, Sn—Ag, without the use of copper. The connectors 802 may form a grid, such as a ball grid array (BGA). In some embodiments, a reflow process may be performed, giving the connectors 802 a shape of a partial sphere in some embodiments. Alternatively, the connectors 802 may comprise other shapes. The connectors 802 may also comprise non-spherical conductive connectors, for example.

Figure 10:
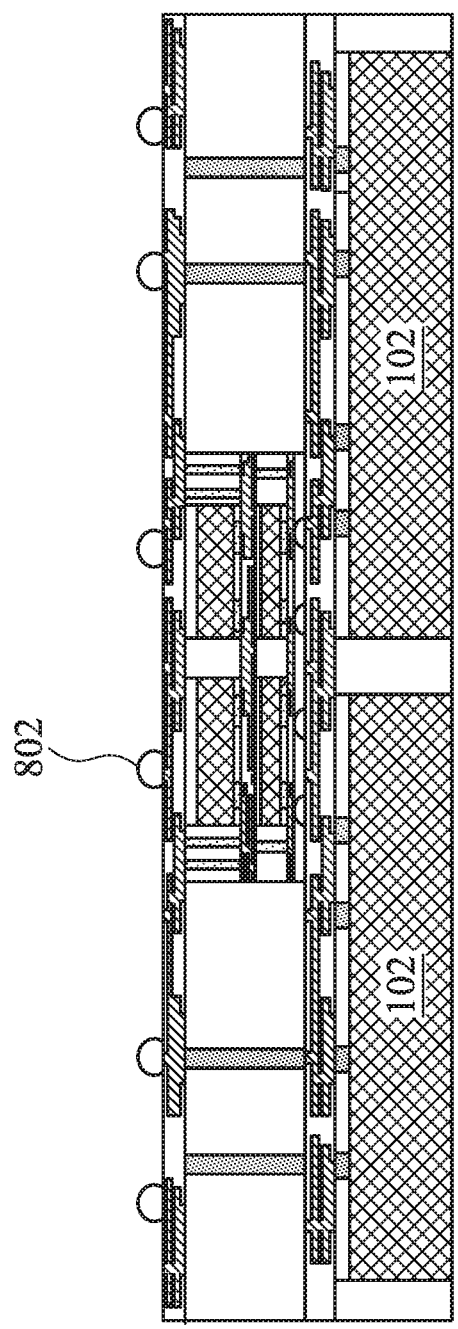

Next, the carrier substrate 300 is de-bonded. The resulting structure 800 is depicted in FIG. 10. If a plurality of structures 800 have been created on a wafer, the individual structures 800 are singulated into individual package structures.

Figure 11:
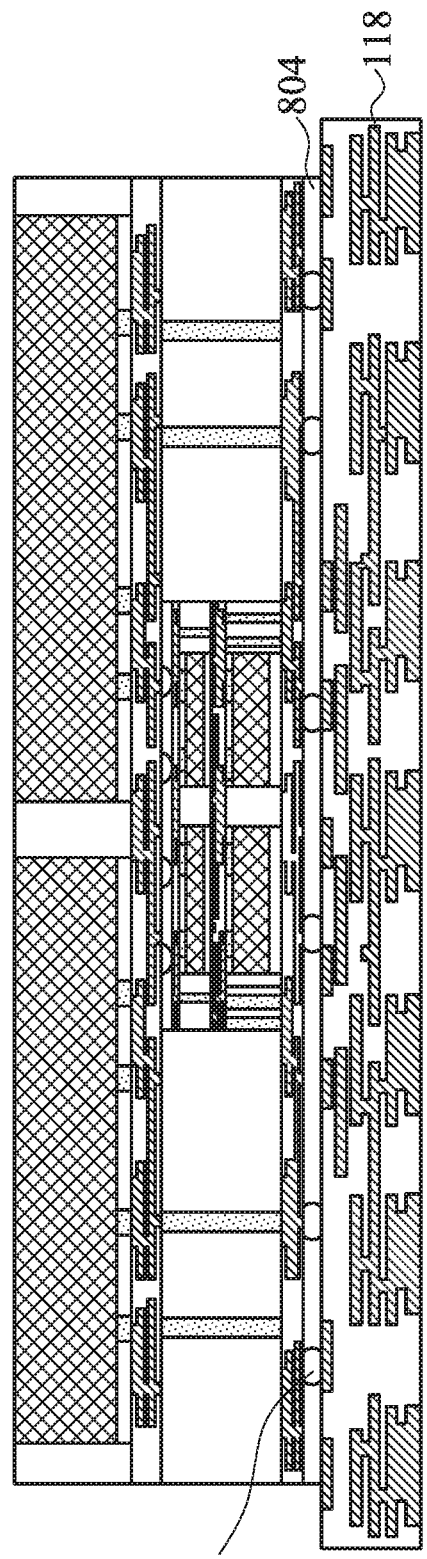

Referring to FIG. 11, the structure 800 is flipped and bonded to a substrate 118 via connectors 802. Substrate 118 may be a build-up laminate substrate that is commonly known, using a number of layers that is determined according to the particular approach. Substrate 118 may provide mechanical strength to the package in addition to enabling electrical connection among components in structure 800 as well as enabling electrical connection to external substrates, components, devices, the like, or a combination thereof. Substrate 118 may be wider than structure 800. In some embodiments, substrate 118 may extend 5 mm to 10 mm beyond the edges of structure 800.

An underfill material 804 may be injected or otherwise formed in the space between the connectors 802 and substrate 118. The underfill material 804 may, for example, comprise a liquid epoxy, deformable gel, silicon rubber, or the like, that is dispensed between the connectors 802 and substrate 118, and then cured to harden. This underfill material 804 is used, among other things, to reduce cracking and to protect the connectors 802.

Figure 12:
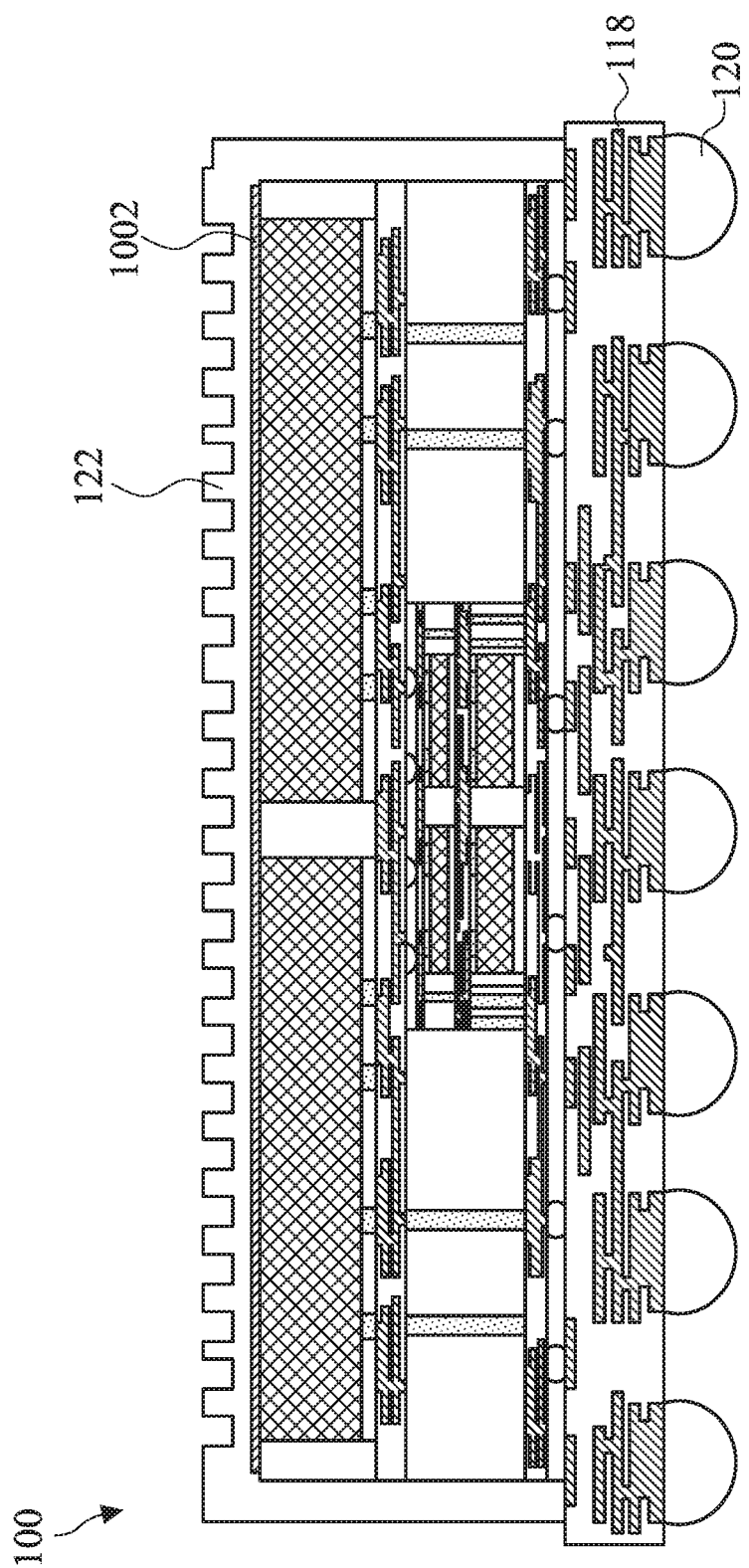

Referring to FIG. 12, a thermal interface material 1002 is applied to a top surface of molding material 114 and logic dies 102. Thermal interface material 1002 may help to dissipate heat from the package structure to a heat dissipation lid which is subsequently applied, thereby helping to maintain a lower temperature in the package structure. Thermal interface material 1002 may comprise any suitable thermally conductive material, for example, a polymer having a good thermal conductivity, which may be between about 3 watts per meter kelvin (W/m·K) to about 5 W/m·K or more. Next, heat dissipation lid 122 is attached. Heat dissipation lid 122 may provide physical protection to the package structure in addition to dissipating heat. Heat dissipation lid 122 may have a high thermal conductivity, for example, between about 200 W/m·K to about 400 W/m·K or more, and may be formed using a metal, a metal alloy, graphene, carbon nanotubes (CNT), and the like. Heat dissipation lid 122 is attached to substrate 118, in some embodiments using adhesive or the like, so that the logic dies 102, memory structure 108, and the other components of the package structure discussed above are arranged within an inner cavity of the heat dissipation lid 122.

Next, as depicted in FIG. 12, a plurality of electrical connectors 120 are attached to the substrate 118 on a surface of substrate 118 opposite to the package structure. Connectors 120 allow the structure to electrically couple to other packages, components, devices, substrates, the like, or a combination thereof. The connectors 120 may be solder balls, metal pillars, controlled collapse chip connection (C4) bumps, micro bumps, electroless nickel-electroless palladium-immersion gold technique (ENEPIG) formed bumps, combination thereof (e.g., a metal pillar having a solder ball attached thereof), or the like. The connectors 120 may include a conductive material such as solder, copper, aluminum, gold, nickel, silver, palladium, tin, the like, or a combination thereof. In some embodiments, the connectors 120 comprise a eutectic material and may comprise a solder bump or a solder ball, as examples. The solder material may be, for example, lead-based and lead-free solders, such as Pb—Sn compositions for lead-based solder; lead-free solders including InSb; tin, silver, and copper (SAC) compositions; and other eutectic materials that have a common melting point and form conductive solder connections in electrical applications. For lead-free solder, SAC solders of varying compositions may be used, such as SAC 105 (Sn 98.5%, Ag 1.0%, Cu 0.5%), SAC 305, and SAC 405, as examples. Lead-free connectors such as solder balls may be formed from SnCu compounds as well, without the use of silver (Ag). Alternatively, lead-free solder connectors may include tin and silver, Sn—Ag, without the use of copper. The connectors 120 may form a grid, such as a ball grid array (BGA). In some embodiments, a reflow process may be performed, giving the connectors 120 a shape of a partial sphere in some embodiments. Alternatively, the connectors 120 may comprise other shapes. The connectors 120 may also comprise non-spherical conductive connectors, for example.

In some embodiments, as described above, connectors 120 may be connected to RDL 104, instead of substrate 118. In these embodiments, many of the processing steps described above, including forming through vias 112, forming molding material 106, forming RDL 116, and bonding the package to substrate 118 are unnecessary, and manufacturing costs may be reduced. Such an embodiment is depicted in FIG. 4.

Certain embodiments of package structure 100, assembled as described herein and depicted in FIG. 12, with stacked memory in a face-to-face connection with logic dies using a redistribution layer, may be useful in high performance applications requiring high speed access to memory, such as, for example, a storage data center, a server, or applications involving large scale databases and/or analytics, such as finance, life sciences, weather simulation, video coding, and/or seismic imaging. Many other applications are possible. Additionally, package structure 100 may be assembled as described herein in a manner that, when compared to other methods of manufacturing such high performance system-in-package structures, is cost effective and provides higher manufacturing yields. Moreover, the connections between components in the package and external connections to the package may have increased reliability compared to some other such high performance system-in-package structures.

Figure 13:
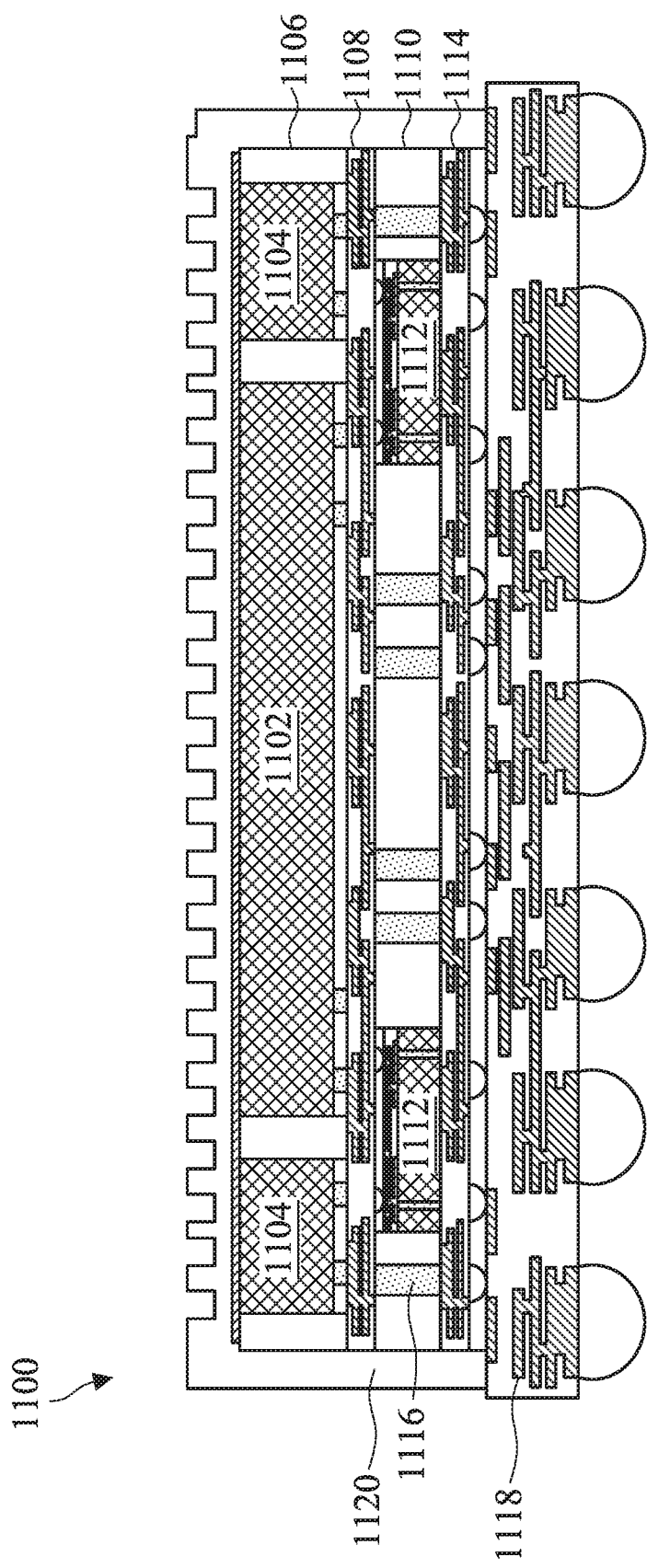
FIGS. 13 to 16 are cross sectional and plan views of package structures according to exemplary embodiments.

Other embodiments are possible. FIG. 13 depicts a package structure 1100 in accordance with some embodiments. Similarly to embodiments described above, certain embodiments of package structure 1100, with one or more interposers in a face-to-face connection with logic and memory dies using a redistribution layer, may be useful in high performance applications requiring high speed access to memory, such as, for example, a personal computer, a notebook, a tablet, a storage data center, or applications involving large scale databases and/or analytics, such as finance, life sciences, weather simulation, video coding, and/or seismic imaging. Many other applications are possible. Additionally, package structure 1100 may be assembled as described herein in a manner that, when compared to other methods of manufacturing such high performance system-in-package structures, is cost effective and provides higher manufacturing yields. For example, compared to high performance packages with one or more interposers embedded in a substrate, package structure 1100 may be manufactured for lower cost and with a higher manufacturing yield in some embodiments. Moreover, the connections between components in the package and external connections to the package have increased reliability compared to other such high performance system-in-package structures.

Package structure 1100 comprises a logic die 1102 and two memory dies 1104 encased in a molding material 1106, although more or less logic dies and memory dies are possible depending on the particular approach. The logic die and the memory die 1004 are disposed over an RDL 1108. RDL 1108 is in turn disposed over molding material 1110. Two interposers 1112 are disposed in molding material 1110. More or less interposers are possible, depending on the particular approach. Each interposer 1112 is positioned so that it partially underlies both a memory die 1104 and a logic die 1102, and interposers 1112 and dies 1104 and 1102 are oriented so they are in a face-to-face connection through RDL 1108. RDL 1114 underlies molding material 1110. Through vias 1116 penetrate through molding material 1110 and interconnect RDL 1108 and RDL 1114. RDL 1114 is disposed over substrate 1118. Heat dissipation lid 1120 is disposed on substrate 1118, with logic die 1102, memory dies 1104 and interposers 1112 disposed in a cavity of heat dissipation lid 1120. The number of logic dies 1102, memory dies 1104, and interposers 1112 can be increased or decreased depending on the application needs.

Interposers 1112 may provide an increased number of electrical paths, connections, and the like, in a smaller area than would otherwise be possible. For example, a process limit for metal lines in an RDL may be about 2 μm to 10 μm. In comparison, a process limit for metal lines in an interposer may be about 0.2 μm to about 0.6 μm. Because of the reduced process limits, interposers 1112 may enable package structure 1100 to have a significantly larger amount of connections in a given area than would otherwise be possible. Interposers 1112 are arranged in a face-to-face connection with logic die 1102 and memory dies 1104 through RDL 1108. Interposers 1112 may have one or more through vias connecting an overlying RDL with an underlying RDL. Interposers 1112 may comprise one or more integrated passive devices, such as resistors, capacitors, inductors, the like, or a combination thereof.

Figure 14:
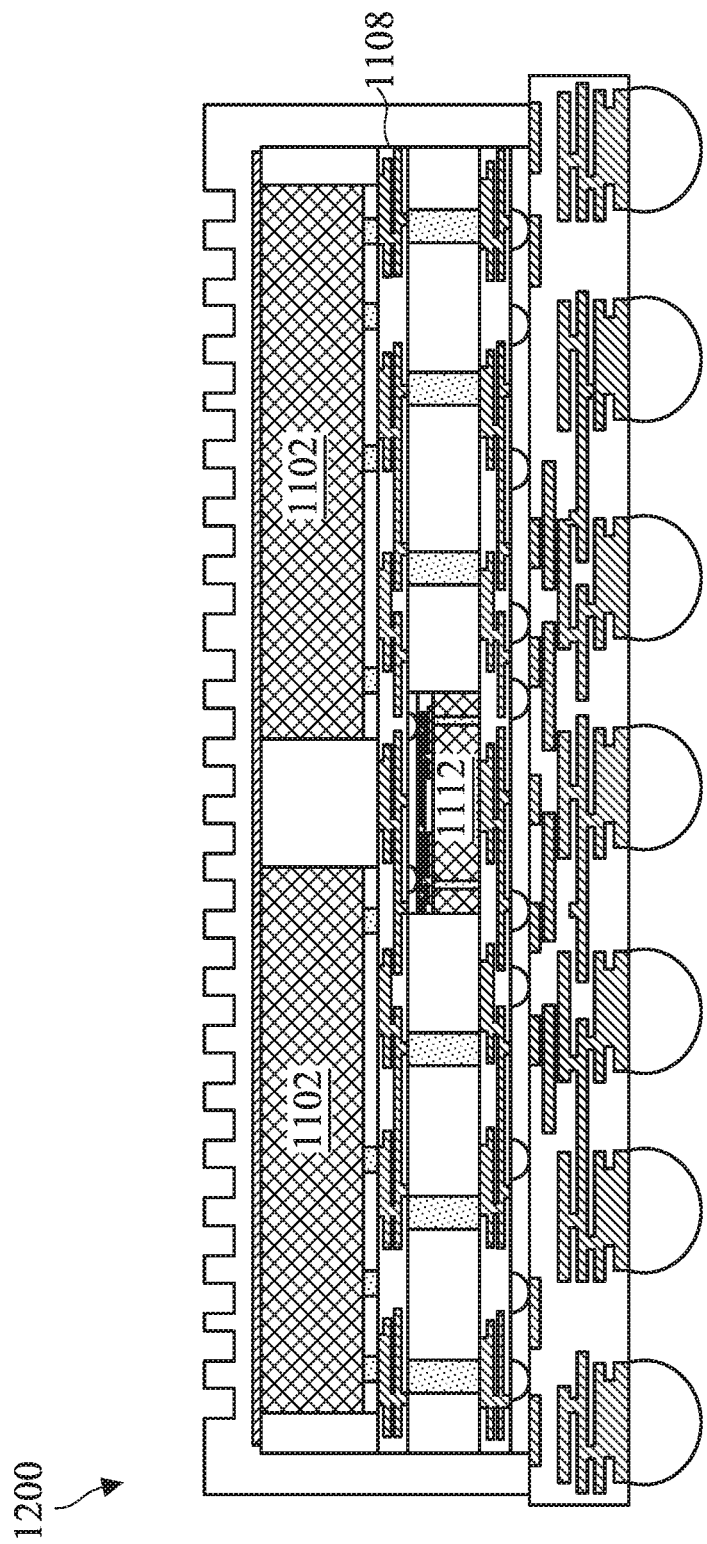

Other embodiments are possible. FIG. 14 depicts a cross section of a package structure 1200 according to some embodiments. Package structure 1200 comprises two logic dies 1102, disposed on a top side of RDL 1108. In this embodiment, interposer 1112 is disposed on an underside of RDL 1108, positioned so that it underlies both logic dies in part. Logic dies 1102 are in a face-to-face connection with interposer 1112. In this embodiment there are no memory dies. The number of logic dies 1102, and interposers 1112 can be increased or decreased depending on the application needs.

Figure 15:
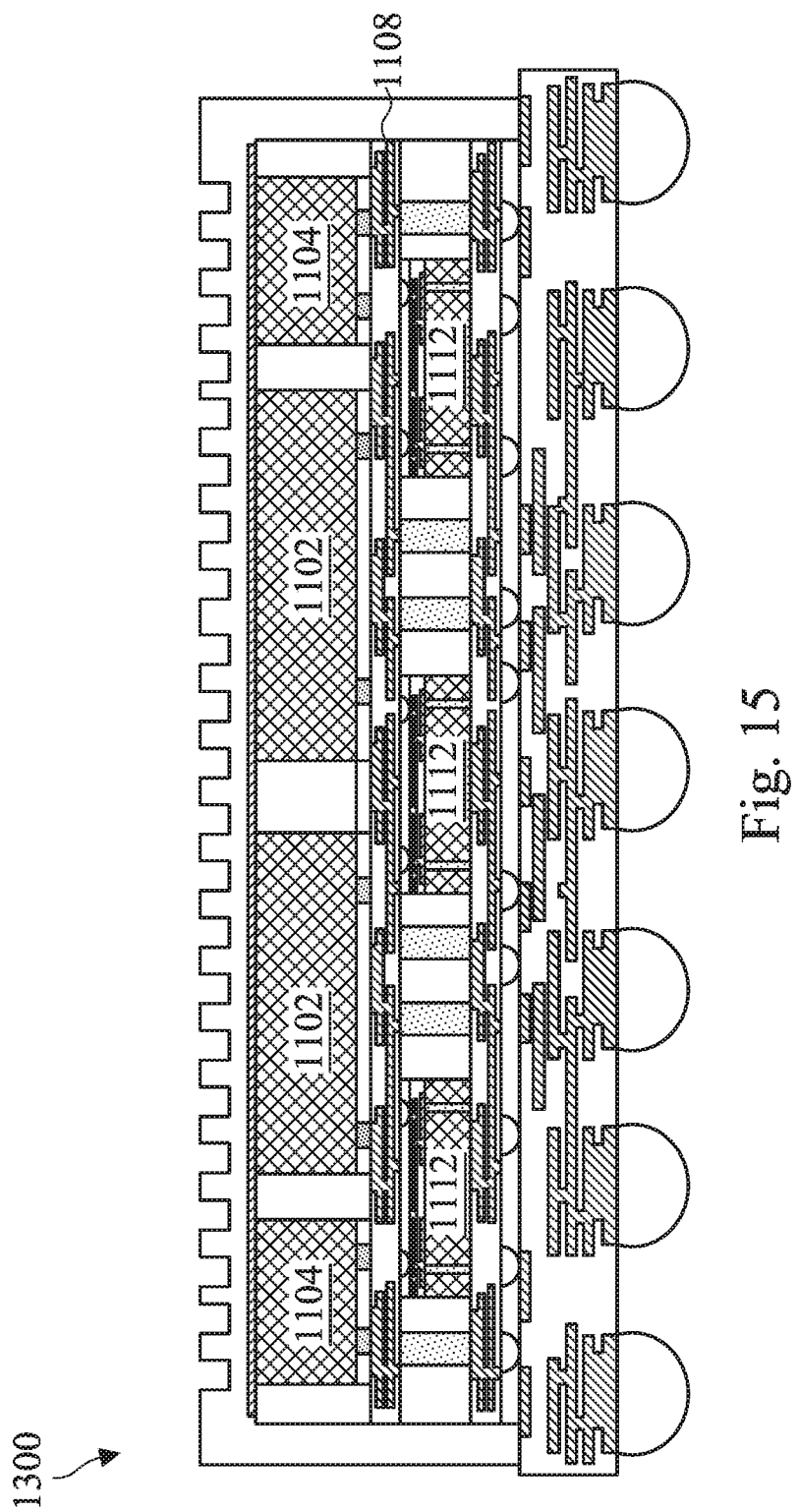

FIG. 15 depicts a cross section of a package structure 1300 according to some embodiments. Package structure 1300 comprises two logic dies 1102 disposed side by side on RDL 1108. Two memory dies 1104 are disposed on RDL 1108 on either side of the two logic dies 1102. Three interposers 1112 are disposed on an underside of RDL 1108, each interposer 1112 being positioned so that it underlies either a memory die 1104 and a logic die 1102, or two logic dies 1102. Logic dies 1102 and memory dies 1104 are in a face-to-face connection with interposers 1112 via RDL 1108. The number of logic dies 1102, memory dies 1104, and interposers 1112 can be increased or decreased depending on the application needs.

Figure 16:
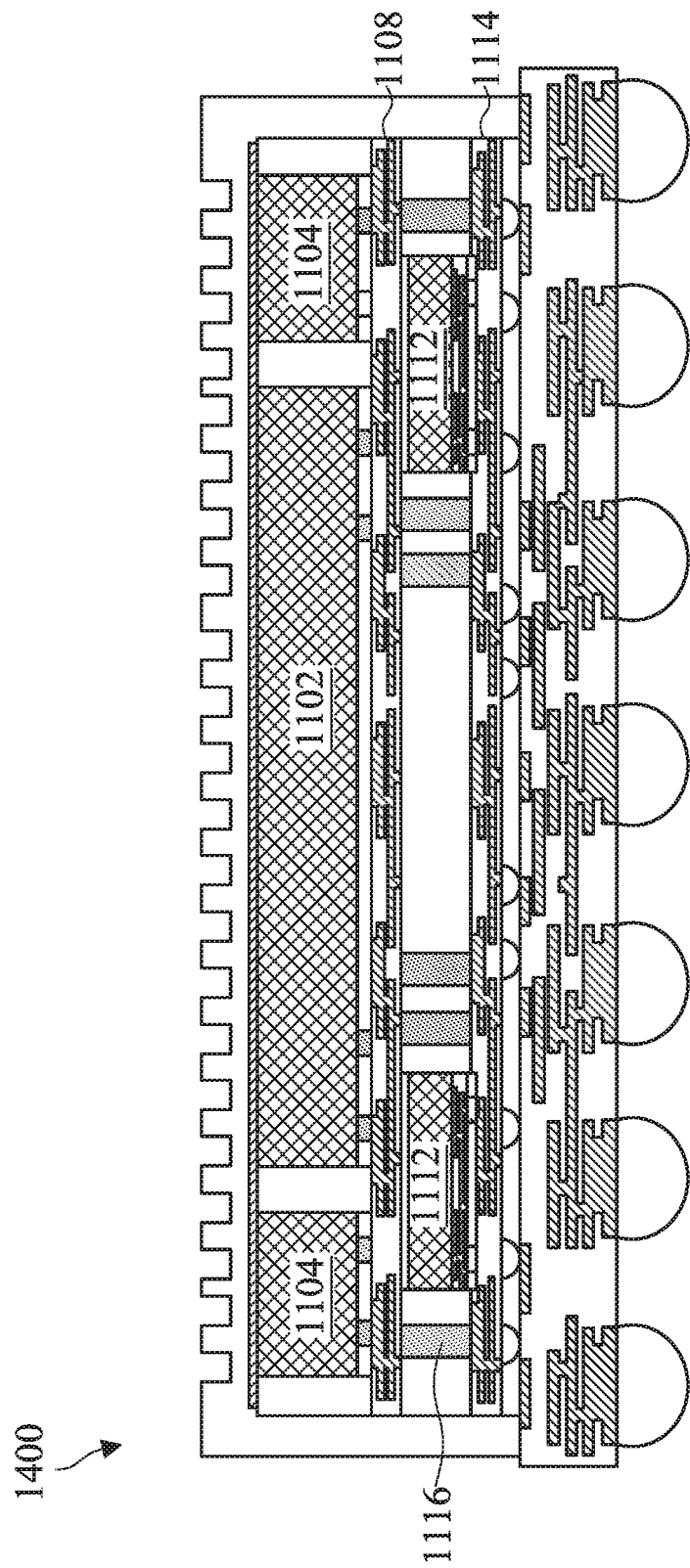

FIG. 16 depicts a cross section of a package structure 1400 according to some embodiments. Package structure 1400 is similar in many respects to package structure 1100. However, in package structure 1400, interposers 1112 do not contain any internal through vias. Logic dies 1102 and memory dies 1104 are in a face-to-back interconnection with interposers 1112 via RDL 1108, through vias 1116, and RDL 1114. The number of logic dies 1102, memory dies 1104, and interposers 1112 can be increased or decreased depending on application needs.

Figure 17:
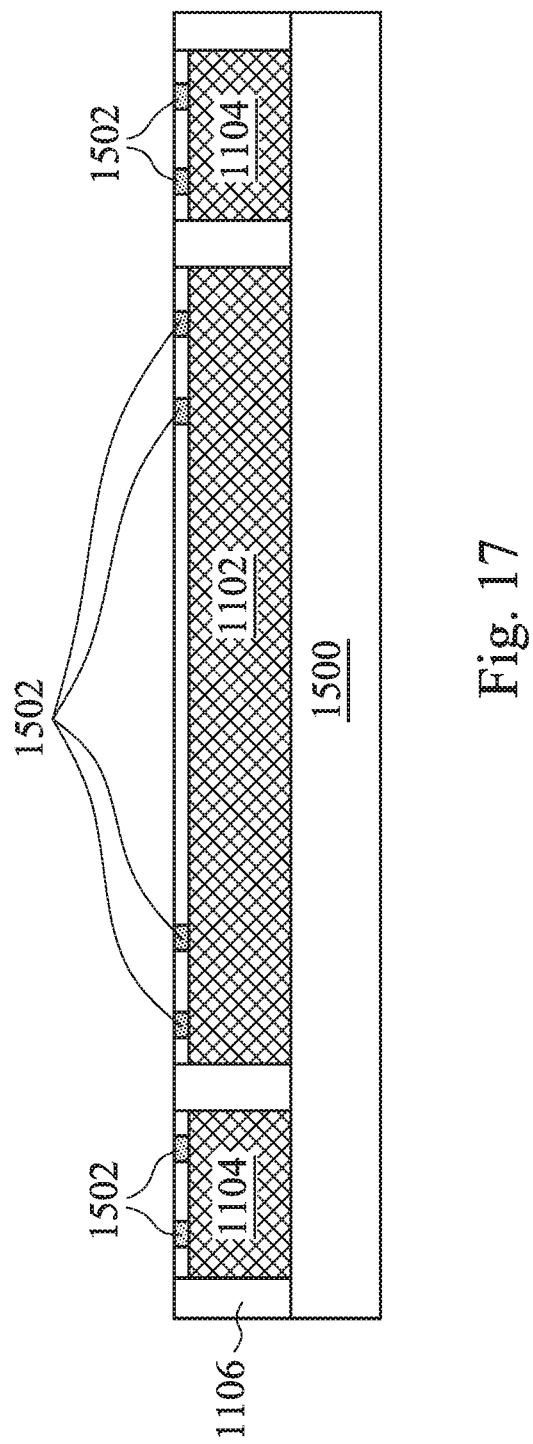
FIGS. 17 to 24 are cross sections of intermediate stages in the making of package structures according to exemplary embodiments.

FIGS. 17-24 illustrate cross-sectional views of intermediate steps in forming a package structure in accordance with some embodiments. Referring first to FIG. 17, there is shown a carrier substrate 1500. Generally, the carrier substrate 1500 provides temporary mechanical and structural support during subsequent processing steps. The carrier substrate 1500 may include any suitable material, such as, for example, silicon based materials, such as a silicon wafer, glass or silicon oxide, or other materials, such as aluminum oxide, a ceramic material, combinations of any of these materials, or the like. In some embodiments, the carrier substrate 300 is planar in order to accommodate further processing.

Logic die 1102 is placed over the carrier substrate 1500. Logic die 1102 may include any kind of logic or processing die suitable for a particular approach, such as a CPU, a GPU, a network processor, an ASIC, a combination thereof, or the like. Memory dies 1104 are also placed over the carrier substrate 1500, with the logic die 1102 positioned between two memory dies 1104. Memory dies 1104 may be any kind of memory suitable for a particular approach, such as an access memory (SRAM) chip or a dynamic random access memory (DRAM) chip. Logic die 1102 and memory dies 1104 may be attached to carrier substrate 1500 by an adhesive layer (not shown), such as a die-attach film (DAF). All dies comprise metal contacts 1502 on a surface of the die that faces away from the carrier substrate 1500. Metal contacts 1502 allow logic die 1102 and memory dies 1104 to electrically connect to external components and packages.

Next, molding material 1106 is molded on logic die 1102 and memory dies 1104. Molding material 1106 fills the gaps between dies. Molding material 1106 may include a molding compound, a molding underfill, an epoxy, or a resin. On application, the top surface of molding material 1106 is higher than the top ends of metal contacts 1502. A grinding step is performed to thin molding material 1106, until metal contacts 1502 are exposed. The resulting structure is shown in FIG. 17. Due to the grinding, the top ends of the metal contacts 1502 are substantially level (coplanar) with the top ends of molding material 1106. As a result of the grinding, metal residues such as metal particles may be generated, and left on the top surfaces. Accordingly, after the grinding, a cleaning may be performed, for example, through a wet etching, so that the metal residue is removed.

Figure 18:
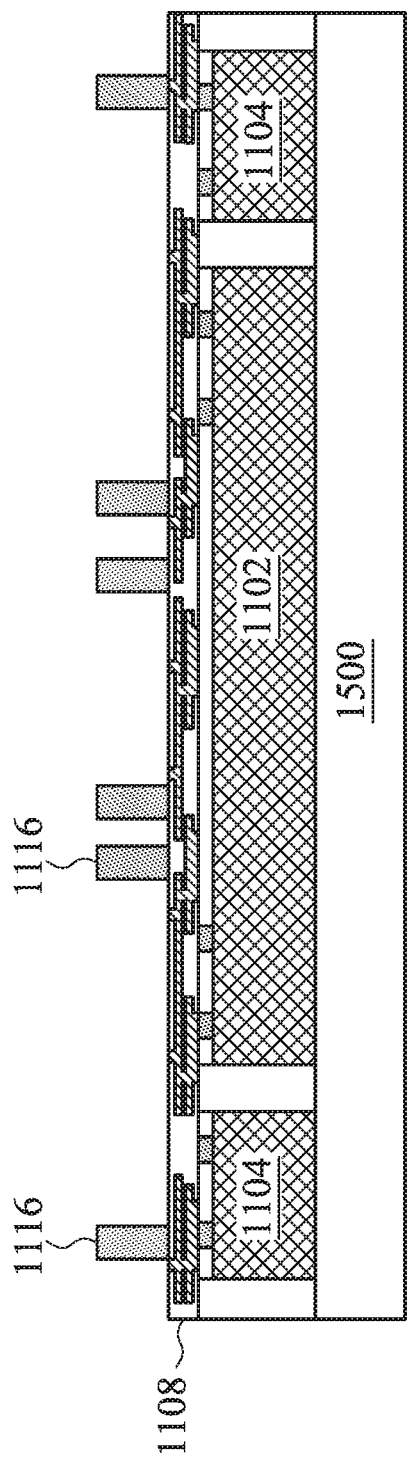

Referring to FIG. 18, a layer of RDL 1108 is formed over the molding material 1106. RDL 1108 provides a conductive pattern that allows a pin-out contact pattern for a package that is different than the pattern of the metal contacts 1502 on the dies, allowing for greater flexibility in the placement of the dies.

The RDLs may be formed using any suitable process, as described above. For example, in some embodiments, a first dielectric layer is formed on the molding material 1106 and the dies. In some embodiments, the first dielectric layer is formed of a polymer, which may be a photo-sensitive material such as polybenzoxazole (PBO), polyimide, benzocyclobutene (BCB), or the like, that may be patterned using lithography. In other embodiments, the first dielectric layer is formed of a nitride such as silicon nitride, an oxide such as silicon oxide, PhosphoSilicate Glass (PSG), BoroSilicate Glass (BSG), Boron-doped PhosphoSilicate Glass (BPSG), or the like. The first dielectric layer may be formed by spin coating, lamination, CVD, the like, or a combination thereof. The first dielectric layer is then patterned to form openings to expose metal contacts 1502 in the dies. In embodiments in which the first dielectric layer is formed of a photo-sensitive material, the patterning may be performed by exposing the first dielectric layer in accordance with a desired pattern and developed to remove the unwanted material, thereby exposing the metal contacts 1502. Other methods, such as using a patterned mask and etching, may also be used to pattern the first dielectric layer.

Next, a seed layer (not shown) is formed over the first dielectric layer and in the openings formed in the first dielectric layer. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD, or the like. A mask is then formed and patterned on the seed layer in accordance with a desired redistribution pattern. In some embodiments, the mask is a photoresist formed by spin coating or the like and exposed to light for patterning. The patterning forms openings through the mask to expose the seed layer. A conductive material is formed in the openings of the mask and on the exposed portions of the seed layer. The conductive material may be formed by plating, such as electroplating or electroless plating, or the like. The conductive material may comprise a metal, like copper, titanium, tungsten, aluminum, or the like. Then, the photoresist and portions of the seed layer on which the conductive material is not formed, are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching. The remaining portions of the seed layer and conductive material form the conductive lines and via connections. A second dielectric layer is formed over the first dielectric layer to provide a more planar surface for subsequent layers and may be formed using similar materials and processes as used to form the first dielectric layer. In some embodiments, the second dielectric layer is formed of polymer, a nitride, an oxide, or the like. In some embodiments, the second dielectric layer is PBO formed by a spin-on process.

Although one layer of RDLs has been described, the processes above may be repeated a number of times to form a plurality of RDL layers, depending on the particular approach.

Next, through vias 1116 are formed over RDL 1108. The through vias 1116 provide an electrical connection from a layer of RDL on one side of a molding compound to another layer of RDL on the other side of the molding compound. For example, as will be explained in greater detail below, an interposer will be placed on RDL 1108 and a molding compound will be formed around the through vias and the interposer. Subsequently, another layer of RDL will be formed overlying the through vias and the interposer. The through vias 1116 provide an electrical connection between overlying RDL and the underlying RDL without having to pass electrical signals through the interposer.

The through vias 1116 may be formed using the same or similar methods as described above, for example, by forming a conductive seed layer (not shown) over RDL 1108. In some embodiments, the seed layer is a metal layer, which may be a single layer or a composite layer comprising a plurality of sub-layers formed of different materials. The seed layer may be made of copper, titanium, nickel, gold, or a combination thereof, or the like. In some embodiments, the seed layer comprises a titanium layer and a copper layer over the titanium layer. The seed layer may be formed using, for example, physical vapor deposition (PVD), CVD, atomic layer deposition (ALD), a combination thereof, or the like. In some embodiments, the seed layer comprises a titanium layer and a copper layer over the titanium layer. In alternative embodiments, the seed layer is a copper layer.

Next, a mask layer, such as a patterned photoresist layer, may be deposited and patterned, wherein openings in the mask layer expose the seed layer. The openings may be filled with a conductive material using, for example, an electroless plating process or an electrochemical plating process, thereby creating the metal features that comprise through vias 1116. The plating process may uni-directionally fill openings (e.g., from the seed layer upwards) in the patterned photoresist layer. Uni-directional filling may allow for more uniform filling of such openings. Alternatively, another seed layer may be formed on sidewalls of the openings in the patterned photoresist layer, and such openings may be filled multi-directionally. The metal features that are formed may comprise copper, aluminum, tungsten, nickel, solder, or alloys thereof. The top-view shapes of through vias 1116, comprising the metal features and the underlying portions of the seed layer, may be rectangles, squares, circles, or the like. The heights of through vias 1116 are determined by the thickness of the subsequently placed interposer(s), with the heights of through vias 1116 greater than the thickness of the interposer(s) in some embodiments.

Next, the mask layer may be removed, for example in an ashing and/or wet strip process. Next, an etch step is performed to remove the exposed portions of the seed layer, wherein the etching may be an anisotropic etching. The portions of the seed layer that are part of the through vias 1116 and overlapped by metal features, on the other hand, remain not etched. It is noted that, when the seed layer is formed of a material similar to or the same as the overlying metal features, the seed layer may be merged with the metal with no distinguishable interface between. In some embodiments, there exist distinguishable interfaces between the seed layer and the overlying metal features. The through vias 1116 can also be realized with metal wire studs placed by a wire bonding process, such as a copper wire bonding process. The use of a wire bonding process may eliminate the need for depositing a seed layer, depositing and patterning a mask layer, and plating to form the through vias 1116.

Figure 19:
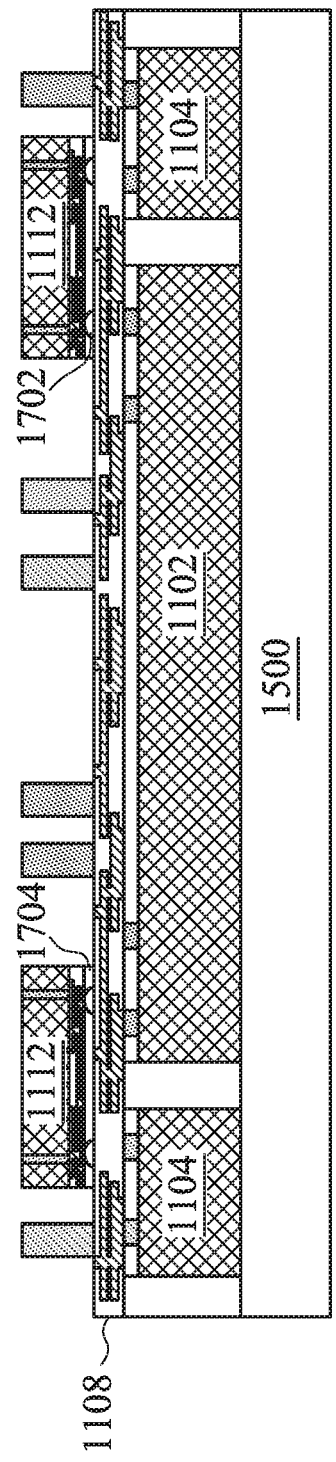

Next, referring to FIG. 19, interposers 1112 are bonded to RDL 1108. Interposers 1112 may comprise one or more electrical connectors 1702 on an underside of the structure. The connectors 1702 may be solder balls, metal pillars, controlled collapse chip connection (C4) bumps, micro bumps, electroless nickel-electroless palladium-immersion gold technique (ENEPIG) formed bumps, combination thereof (e.g., a metal pillar having a solder ball attached thereof), or the like. The connectors 1702 may include a conductive material such as solder, copper, aluminum, gold, nickel, silver, palladium, tin, the like, or a combination thereof. In some embodiments, the connectors 1702 comprise a eutectic material and may comprise a solder bump or a solder ball, as examples. The solder material may be, for example, lead-based and lead-free solders, such as Pb—Sn compositions for lead-based solder; lead-free solders including InSb; tin, silver, and copper (SAC) compositions; and other eutectic materials that have a common melting point and form conductive solder connections in electrical applications. For lead-free solder, SAC solders of varying compositions may be used, such as SAC 105 (Sn 98.5%, Ag 1.0%, Cu 0.5%), SAC 305, and SAC 405, as examples. Lead-free connectors such as solder balls may be formed from SnCu compounds as well, without the use of silver (Ag). Alternatively, lead-free solder connectors may include tin and silver, Sn—Ag, without the use of copper. The connectors 1702 may form a grid, such as a ball grid array (BGA). In some embodiments, a reflow process may be performed, giving the connectors 1702 a shape of a partial sphere in some embodiments. Alternatively, the connectors 1702 may comprise other shapes. The connectors 1702 may also comprise non-spherical conductive connectors, for example. In some embodiments, the connectors 1702 comprise metal pillars (such as a copper pillar) formed by a sputtering, printing, electro plating, electroless plating, CVD, or the like, with or without a solder material thereon. The metal pillars may be solder free and have substantially vertical sidewalls or tapered sidewalls.

An underfill material 1704 may be injected or otherwise formed in the space between the connectors 1702 and RDL 1108. The underfill material 1704 may, for example, comprise a liquid epoxy, deformable gel, silicon rubber, or the like, that is dispensed between the connectors 1702 and RDL 1108, and then cured to harden. This underfill material 1704 is used, among other things, to reduce cracking in and to protect the connectors 1702.

Figure 20:
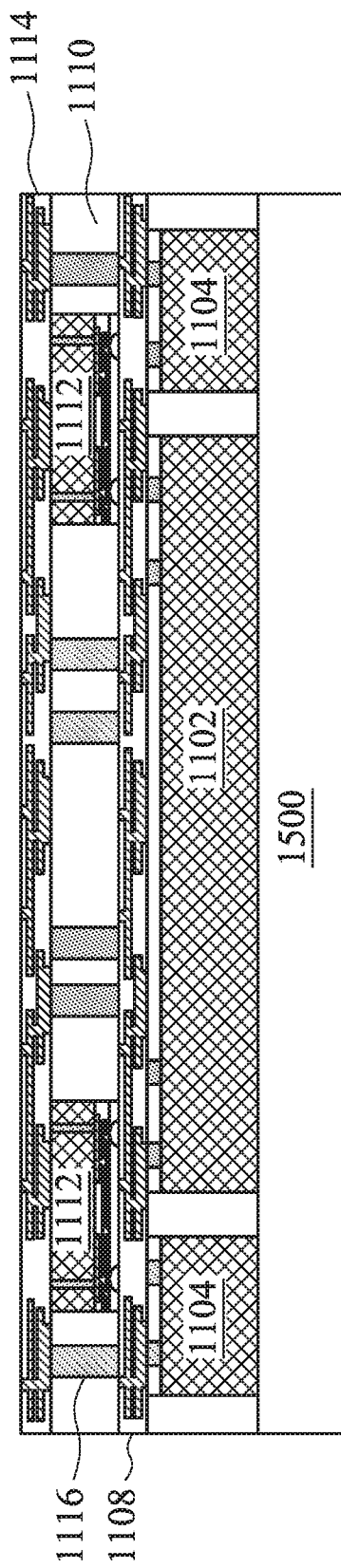

Next, referring to FIG. 20, molding material 1110 is molded on through vias 1116 and interposers 1112. Molding material 1110 fills the gaps between the through vias 1116 and interposers 1112. Molding material 1110 may include a molding compound, a molding underfill, an epoxy, or a resin. The top surface of molding material 1110 is higher than the top ends of through vias 112 and interposers 1112. A grinding step is performed to thin molding material 1110, until through vias 1116 and the through vias in interposers 1112 are exposed. Due to the grinding, the top ends of the through vias 1116 and the through vias in interposers 1112 are substantially level (coplanar) with the top ends of molding material 1110. As a result of the grinding, metal residues such as metal particles may be generated, and left on the top surfaces. Accordingly, after the grinding, a cleaning may be performed, for example, through a wet etching, so that the metal residue is removed.

A layer of RDL 1114 is formed overlying molding material 1110. RDL 1114 may be formed using similar processes as described above. For example, in some embodiments, a first dielectric layer is formed on the molding material 1110. In some embodiments, the first dielectric layer is formed of a polymer, which may be a photo-sensitive material such as polybenzoxazole (PBO), polyimide, benzocyclobutene (BCB), or the like, that may be patterned using lithography. In other embodiments, the first dielectric layer is formed of a nitride such as silicon nitride, an oxide such as silicon oxide, PhosphoSilicate Glass (PSG), BoroSilicate Glass (BSG), Boron-doped PhosphoSilicate Glass (BPSG), or the like. The first dielectric layer may be formed by spin coating, lamination, CVD, the like, or a combination thereof. The first dielectric layer is then patterned to form openings to expose through vias 1116 and through vias in interposers 1112. In embodiments in which the first dielectric layer is formed of a photo-sensitive material, the patterning may be performed by exposing the first dielectric layer in accordance with a desired pattern and developed to remove the unwanted material, thereby exposing through vias 1116 and through vias in interposers 1112. Other methods, such as using a patterned mask and etching, may also be used to pattern the first dielectric layer.

Next, a seed layer (not shown) is formed over the first dielectric layer and in the openings formed in the first dielectric layer. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD, or the like. A mask is then formed and patterned on the seed layer in accordance with a desired redistribution pattern. In some embodiments, the mask is a photoresist formed by spin coating or the like and exposed to light for patterning. The patterning forms openings through the mask to expose the seed layer. A conductive material is formed in the openings of the mask and on the exposed portions of the seed layer. The conductive material may be formed by plating, such as electroplating or electroless plating, or the like. The conductive material may comprise a metal, like copper, titanium, tungsten, aluminum, or the like. Then, the photoresist and portions of the seed layer on which the conductive material is not formed, are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching. The remaining portions of the seed layer and conductive material form the conductive lines and via connections. A second dielectric layer is formed over the first dielectric layer to provide a more planar surface for subsequent layers and may be formed using similar materials and processes as used to form the first dielectric layer. In some embodiments, the second dielectric layer is formed of polymer, a nitride, an oxide, or the like. In some embodiments, the second dielectric layer is PBO formed by a spin-on process.

Although the formation of one layer of RDLs has been described, the processes above may be repeated a number of times to form a plurality of RDL layers, depending on the particular approach.

Figure 21:
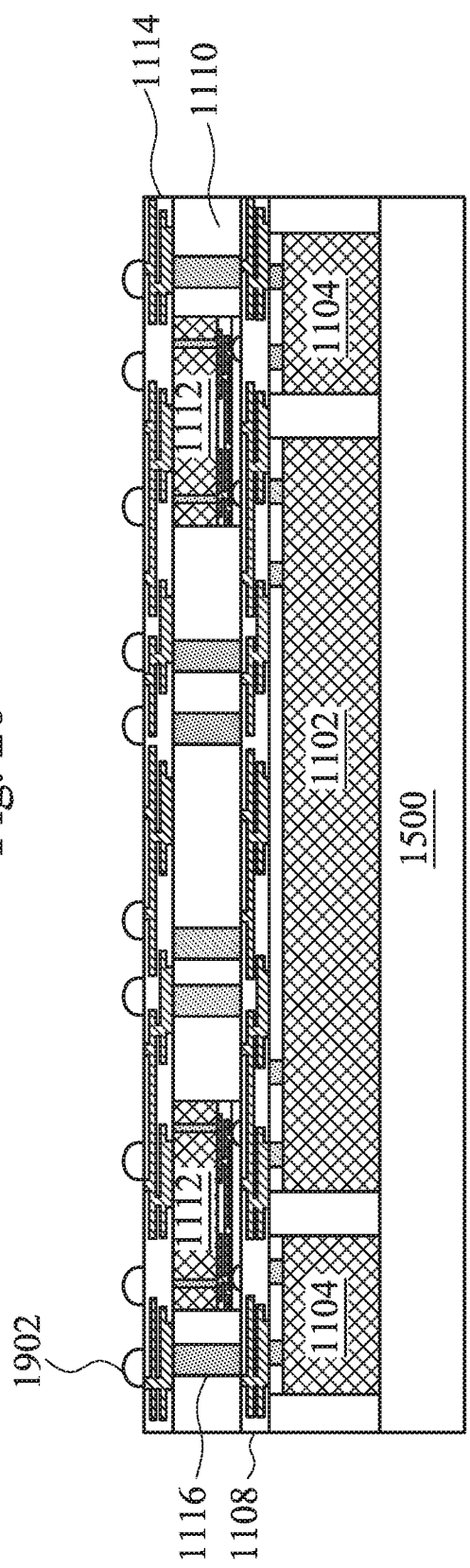

Next, referring to FIG. 21, connectors 1902 are attached to RDL 1114. Connectors 1902 allow the structure to electrically couple to other packages, components, devices, substrates, the like, or a combination thereof. The connectors 1902 may be solder balls, metal pillars, controlled collapse chip connection (C4) bumps, micro bumps, electroless nickel-electroless palladium-immersion gold technique (ENEPIG) formed bumps, combination thereof (e.g., a metal pillar having a solder ball attached thereof), or the like. The connectors 1902 may include a conductive material such as solder, copper, aluminum, gold, nickel, silver, palladium, tin, the like, or a combination thereof. In some embodiments, the connectors 1902 comprise a eutectic material and may comprise a solder bump or a solder ball, as examples. The solder material may be, for example, lead-based and lead-free solders, such as Pb—Sn compositions for lead-based solder; lead-free solders including InSb; tin, silver, and copper (SAC) compositions; and other eutectic materials that have a common melting point and form conductive solder connections in electrical applications. For lead-free solder, SAC solders of varying compositions may be used, such as SAC 105 (Sn 98.5%, Ag 1.0%, Cu 0.5%), SAC 305, and SAC 405, as examples. Lead-free connectors such as solder balls may be formed from SnCu compounds as well, without the use of silver (Ag). Alternatively, lead-free solder connectors may include tin and silver, Sn—Ag, without the use of copper. The connectors 1902 may form a grid, such as a ball grid array (BGA). In some embodiments, a reflow process may be performed, giving the connectors 1902 a shape of a partial sphere in some embodiments. Alternatively, the connectors 1902 may comprise other shapes. The connectors 1902 may also comprise non-spherical conductive connectors, for example.

Figure 22:
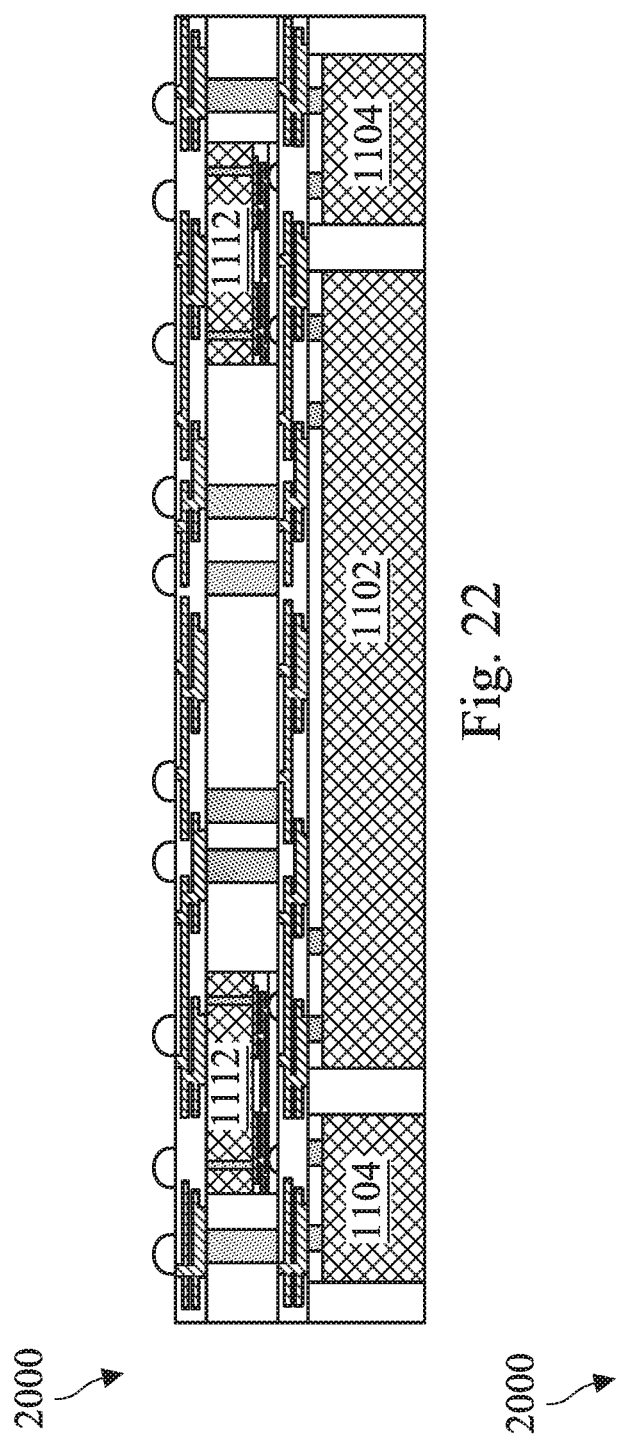

Next, the carrier substrate 1500 is de-bonded. The resulting structure 2000 is depicted in FIG. 22. If a plurality of structures 2000 has been created on a wafer, the individual structures 2000 are singulated into individual package structures.

Figure 23:
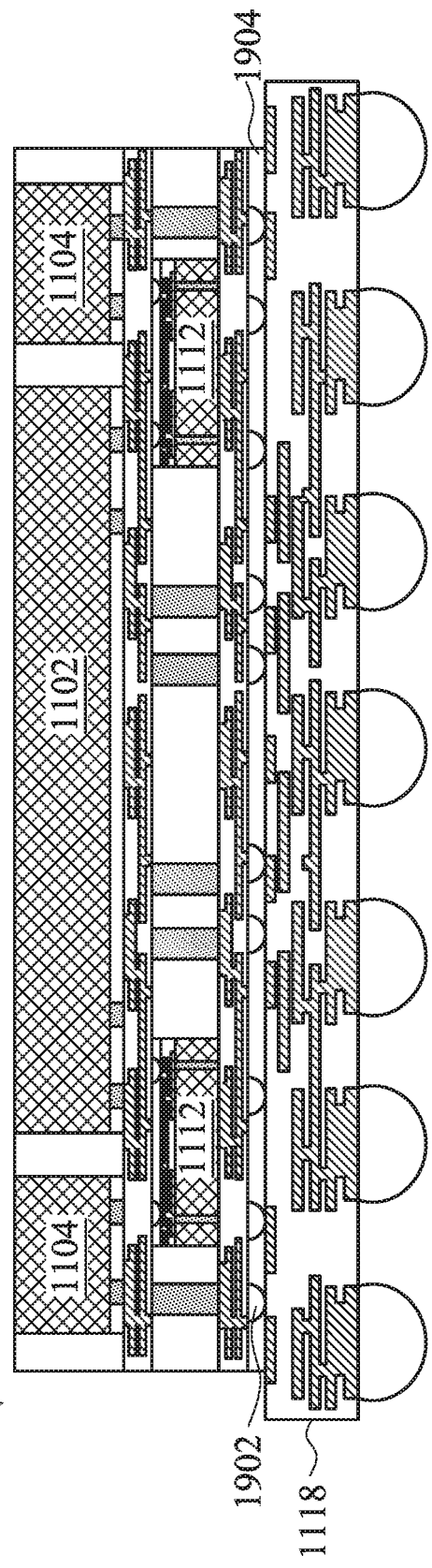

Referring to FIG. 23, the structure 2000 is flipped and bonded to a substrate 1118 via connectors 1902. Substrate 1118 may be a build-up laminate substrate that is commonly known, using a number of layers that is determined according to the particular approach. Substrate 1118 may provide mechanical strength to the package in addition to enabling electrical connection among components in structure 2000 as well as enabling electrical connection to external substrates, components, devices, the like, or a combination thereof. Substrate 1118 may be wider than structure 2000. In some embodiments, substrate 1118 may extend about 5 mm to about 10 mm beyond the edges of structure 2000.

An underfill material 1904 may be injected or otherwise formed in the space between the connectors 1902 and substrate 1118. The underfill material 1904 may, for example, comprise a liquid epoxy, deformable gel, silicon rubber, or the like, that is dispensed between the connectors 1902 and substrate 1118, and then cured to harden. This underfill material 1904 is used, among other things, to reduce cracking in and to protect the connectors 1902.

Figure 24:
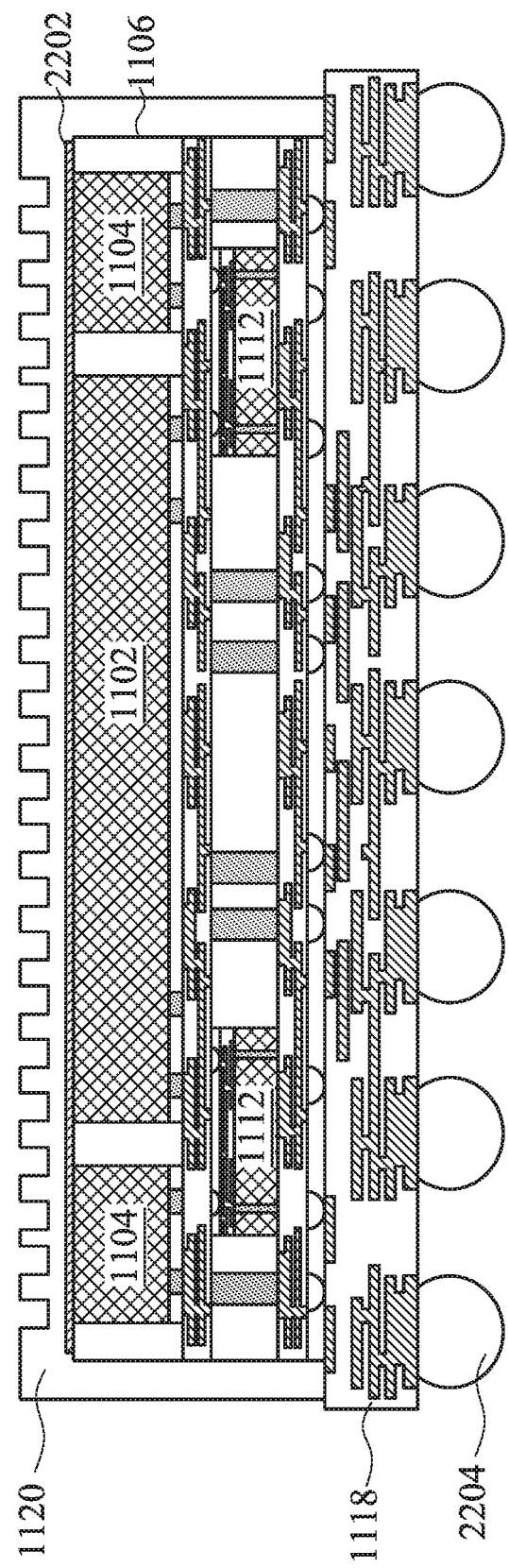

Referring to FIG. 24, a thermal interface material 2202 is applied to a top surface of molding material 1106 and dies 1102 and 1104. Thermal interface material 2202 may help to dissipate heat from the package structure to a lid which is subsequently applied, thereby helping to maintain a lower temperature in the package structure. Thermal interface material 2202 may comprise any suitable thermally conductive material, for example, a polymer having a good thermal conductivity, which may be between about 3 watts per meter kelvin (W/m·K) to about 5 W/m·K or more. Next, heat dissipation lid 1120 is attached. Heat dissipation lid may provide physical protection to the package structure in addition to dissipating heat. Heat dissipation lid 1120 may have a high thermal conductivity, for example, between about 200 W/m·K to about 400 W/m·K or more, and may be formed using a metal, a metal alloy, grapheme, carbon nanotubes (CNT), and the like. Heat dissipation lid 1120 is attached to substrate 1118, in some embodiments using adhesive or the like, so that the logic die 1102, interposers 1112, and the other components of the package structure discussed above are arranged within a cavity of the heat dissipation lid 1120.

Next, as depicted in FIG. 24, a plurality of electrical connectors 2204 are attached to the substrate 1118 on a surface of substrate 1118 opposite to the structure 2000.

Connectors 2204 allow the package structure to electrically couple to other packages, components, devices, substrates, the like, or a combination thereof. The connectors 2204 may be solder balls, metal pillars, controlled collapse chip connection (C4) bumps, micro bumps, electroless nickel-electroless palladium-immersion gold technique (ENEPIG) formed bumps, combination thereof (e.g., a metal pillar having a solder ball attached thereof), or the like. The connectors 2204 may include a conductive material such as solder, copper, aluminum, gold, nickel, silver, palladium, tin, the like, or a combination thereof. In some embodiments, the connectors 2204 comprise a eutectic material and may comprise a solder bump or a solder ball, as examples. The solder material may be, for example, lead-based and lead-free solders, such as Pb—Sn compositions for lead-based solder; lead-free solders including InSb; tin, silver, and copper (SAC) compositions; and other eutectic materials that have a common melting point and form conductive solder connections in electrical applications. For lead-free solder, SAC solders of varying compositions may be used, such as SAC 105 (Sn 98.5%, Ag 1.0%, Cu 0.5%), SAC 305, and SAC 405, as examples. Lead-free connectors such as solder balls may be formed from SnCu compounds as well, without the use of silver (Ag). Alternatively, lead-free solder connectors may include tin and silver, Sn—Ag, without the use of copper. The connectors 2204 may form a grid, such as a ball grid array (BGA). In some embodiments, a reflow process may be performed, giving the connectors 2204 a shape of a partial sphere in some embodiments. Alternatively, the connectors 2204 may comprise other shapes. The connectors 1006 may also comprise non-spherical conductive connectors, for example.

In some embodiments, a package structure formed using processes described above and as depicted in FIG. 24, with one or more interposers in a face-to-face connection with logic and memory dies using a redistribution layer, may be useful in high performance applications requiring high speed access to memory, such as, for example, a storage data center, or applications involving large scale databases and/or analytics, such as finance, life sciences, weather simulation, video coding, and/or seismic imaging. Many other applications are possible. Additionally, a package structure may be assembled as described herein in a manner that, when compared to other methods of manufacturing such high performance system-in-package structures, is cost effective and provides higher manufacturing yields. Moreover, the connections between components in the package and external connections to the package may have increased reliability compared to some other such high performance system-in-package structures.

In accordance with some embodiments, a method of making a semiconductor device includes placing a first die and a second die over a carrier substrate. A first molding material is formed adjacent to the first die and the second die. A first redistribution layer is formed, electrically coupled to the first die and the second die and overlying the first molding material. A first copper pillar is formed, coupled to and overlying the first redistribution layer. A package component is placed on the first redistribution layer next to the copper pillar. The package component includes a second redistribution layer, and is positioned so that it overlies both the first die and the second die in part. A second molding material is formed adjacent to the package component and the first copper pillar. A third redistribution layer is formed, electrically coupled to the package component and overlying the second molding material. The carrier substrate is removed. The third redistribution layer is placed on a substrate and bonded to the substrate.

In accordance with some embodiments, a method of forming a semiconductor device includes placing a first die and a second die side by side over a first substrate. A first molding material is formed adjacent to the first die and the second die. A first redistribution layer is formed, electrically coupled to the first die and the second die and overlying the first molding material. A package comprising a third die, a fourth die, and a second redistribution layer is placed over the first redistribution layer so that the package is positioned over the center point of a shortest distance between the first and second die.

In accordance with some embodiments, a semiconductor device includes a first die and a second die positioned next to each other. A first molding material extends along sidewalls of the first die and the second die. A first redistribution layer underlies the first molding material. A first interposer underlies and is connected to the first redistribution layer and is positioned so that it underlies each of the first die and the second die in part. A second molding material extends along sidewalls of the first interposer and a first through via that extends through the second molding material. A second redistribution layer underlies the second molding material. A substrate underlies and is connected to the second redistribution layer.

A semiconductor device is provided in accordance with some embodiments. The device includes a first die disposed on a first surface of a redistribution structure. The device also includes a second die disposed on the first surface of the redistribution structure. The device also includes a molding material extending between the first die and the second die. The device also includes a heat dissipation lid connected to the first surface of the redistribution structure, the first die and the second die being disposed in an inner cavity of the heat dissipation lid. The device also includes a package connected to a second surface of the redistribution structure, the second surface of the redistribution layer being opposite to the first surface of the redistribution structure, the package comprising a plurality of package dies, and the package underlying each of the first die and the second die in part. The device also includes a plurality of first connectors connected to the second surface of the redistribution structure. In an embodiment, a first connector of the plurality of first connectors has a first surface that is farthest from the redistribution structure, the package has a first surface that is farthest from the redistribution structure, and the first surface of the first connector is farther from the redistribution structure than the first surface of the package. In an embodiment, the plurality of first connectors is connected to a substrate, the package being disposed between the redistribution structure and the substrate. In an embodiment, the package is disposed in a recess of the substrate. In an embodiment, a plurality of second connectors are disposed on a surface of the package that is farthest from the redistribution structure, each of the plurality of second connectors being connected to a through via that extends through the package.

A semiconductor device is provided in accordance with some embodiments. The semiconductor device includes a first die and a second die positioned next to each other, wherein a first sidewall of the first die is opposite to a surface of the first die that faces the second die, and a first sidewall of the second die is opposite to a surface of the second die that faces the first die. The device also includes a first molding material extending along the first sidewall of the first die and the first sidewall of the second die. The device also includes a first redistribution layer underlying the first molding material. The device also includes a first interposer underlying and connected to the first redistribution layer, the first interposer being positioned so that it underlies each of the first die and the second die in part, wherein a sidewall of the first interposer that is closest to the first sidewall of the first die is offset from the first sidewall of the first die, and a sidewall of the first interposer that is closest to the first sidewall of the second die is offset from the first sidewall of the second die. The device also includes a second molding material extending along sidewalls of the first interposer. The device also includes a first through via that extends through the second molding material. The device also includes a second redistribution layer underlying the second molding material. The device also includes a substrate underlying and connected to the second redistribution layer. In an embodiment the device also includes a heat dissipation lid on the substrate, wherein the first die, the second die, and the first interposer are disposed in an inner cavity of the heat dissipation lid. In an embodiment the device also includes a third die and a second interposer, wherein the third die is positioned over the first redistribution layer and next to the second die, and wherein the second interposer is positioned so that it underlies the first redistribution layer and each of the second die and the third die in part. In an embodiment the second die is a central processing unit and the first die and the third die are memory dies. In an embodiment the first interposer comprises a second through via extending through the first interposer. In an embodiment the first interposer comprises a plurality of stacked memory dies. In an embodiment the first interposer comprises a plurality of memory dies, a first memory die of the plurality of memory dies being positioned next to a second die of the plurality of memory dies. In an embodiment the first interposer comprises: a first memory die; a second memory die positioned next to the first memory die; and a third redistribution layer overlying the first memory die and the second memory die. In an embodiment the first interposer further comprises: a third memory die; and a fourth memory die, each of the third memory die and the fourth memory die overlying the third redistribution layer. In an embodiment the first interposer comprises at least four stacked memory dies, and a through via extends at least partially through the at least four stacked memory dies.

A semiconductor device is provided in accordance with some embodiments. The device includes three or more dies positioned side by side. The device also includes a first redistribution layer underlying the three or more dies. The device also includes a first package underlying the first redistribution layer, the first package underlying a first die of the three or more dies in part and underlying a second die of the three or more dies in part. The device also includes a molding material extending along sidewalls of the first package. The device also includes a second redistribution layer underlying the first package. The device also includes a plurality of through vias extending through molding material from the first redistribution layer to the second redistribution layer. The device also includes a first substrate underlying the second redistribution layer. The device also includes a heat dissipation lid attached to a first surface of the first substrate, wherein the three or more dies and the first package are disposed within a cavity of the heat dissipation lid. In an embodiment, the first die and the second die are logic dies. In an embodiment, the first die is a logic die and the second die is a memory die. In an embodiment, the first package comprises a plurality of package dies, and a plurality of through vias respectively extend at least partially through the plurality of package dies. In an embodiment, the first package comprises a plurality of through vias and a package redistribution layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a first die disposed on a first surface of a first redistribution structure;
a second die positioned next to the first die and disposed on the first surface of the first redistribution structure;
a package connected to a second surface of the first redistribution structure and overlying a second redistribution structure, the package comprising a plurality of package dies and a plurality of package through vias that are encapsulated in a first molding material, and the second surface being opposite to the first surface, wherein the plurality of package dies comprises a first package die overlying a second package die, the first package die comprising first contacts at a surface of the first package die that faces the first die, and the second package die comprising second contacts at a surface of the second package die that faces the first die;
a second molding material extending along sidewalls of the package, wherein the first die overlaps an interface between the first molding material and the second molding material; and
a first through via extending through the second molding material, wherein the first through via and the second molding material each extend continuously from the first redistribution structure to the second redistribution structure.

2. The semiconductor device of claim 1, wherein the package further comprises a third redistribution structure between the first package die and the second package die.

3. The semiconductor device of claim 2, wherein the plurality of package dies further comprise a third package die positioned next to the first package die, and a fourth package die positioned next to the second package die.

4. The semiconductor device of claim 2, wherein the package further comprises a fourth redistribution structure, the plurality of package through vias comprise a first package through via and a second package through via, the first package through via extends between the second redistribution structure and the third redistribution structure, and the second package through via extends between the third redistribution structure and the fourth redistribution structure.

5. The semiconductor device of claim 1, wherein the first package die and the second package die underlie the first die at least in part, wherein the plurality of package dies further comprises a third package die overlying a fourth package die, and wherein the third package die and the fourth package die underlies the second die at least in part.

6. The semiconductor device of claim 1, wherein the second redistribution structure is disposed on a substrate.

7. The semiconductor device of claim 6, wherein a heat dissipation lid is connected to the substrate, and the first die, the second die, and the package are disposed within an inner cavity of the heat dissipation lid.

8. A semiconductor device, comprising:
a plurality of first dies positioned side by side over a first redistribution structure;
a package underlying the first redistribution structure, the package comprising:
a plurality of second dies;
a first molding material extending along sidewalls of the plurality of second dies;
a plurality of first through vias extending through the first molding material; and
a second redistribution layer underlying the plurality of second dies; and
a third redistribution structure underlying the package;
a second molding material extending along sidewalls of the package, wherein a first die of the plurality of first dies overlaps an interface between the second molding material and the first molding material; and
a substrate underlying the third redistribution structure.

9. The semiconductor device according to claim 8, wherein the package further comprises:
a plurality of third dies underlying the second redistribution layer; and
a third molding material extending along sidewalls of the plurality of third dies, wherein the third molding material is coterminus the first molding material.

10. The semiconductor device according to claim 9, wherein the package further comprises:
a plurality of second through vias extending in the third molding material.

11. The semiconductor device according to claim 8, further comprising:
a plurality of second through vias extending in the second molding material.

12. The semiconductor device according to claim 11, wherein the plurality of second through vias extend between the first redistribution structure and the third redistribution structure.

13. The semiconductor device according to claim 8, wherein the third redistribution structure is connected to the substrate by a plurality of conductive balls.

14. A semiconductor device, comprising:
a first redistribution structure;
a first die connected to a first surface of the first redistribution structure;
a second die connected to the first surface of the first redistribution structure;
a first package connected to a second surface of the first redistribution structure, the first package comprising a third die, a fourth die, and a first molding compound, a first portion of the first molding compound extending continuously from a sidewall of the third die to a sidewall of the fourth die, and the first package underlying the first die in part and the second die at least in part;
a second molding material contacting a second portion of the first molding compound of the first package and a third portion of the first molding compound of the first package;
a second redistribution structure underlying the first package;
a substrate underlying the second redistribution structure; and
a plurality of first through vias extending through the second molding material between the first redistribution structure and the second redistribution structure.

15. The semiconductor device of claim 14, wherein the first package further comprises a fifth die and a sixth die, and wherein the third die and the fourth die are vertically stacked with the fifth die and the sixth die.

16. The semiconductor device of claim 15, wherein the first package further comprises a third redistribution structure between the third die and the fifth die.

17. The semiconductor device of claim 16, wherein the first package further comprises a plurality of second through vias extending through the first molding compound between the third redistribution structure and the second redistribution structure.

18. The semiconductor device of claim 14, wherein the first die overlaps an interface between the second molding material and the second portion of the first molding compound.

19. The semiconductor device of claim 14, wherein the fourth die is disposed side by side with the third die.

* * * * *